US011770949B2

(12) United States Patent
Cho et al.

(10) Patent No.: US 11,770,949 B2
(45) Date of Patent: *Sep. 26, 2023

(54) DISPLAY DEVICE AND HEAD MOUNT DISPLAY DEVICE

(71) Applicant: Samsung Display Co., Ltd., Yongin-si (KR)

(72) Inventors: Sang Hwan Cho, Suwon-si (KR); Chung Sock Choi, Seoul (KR); Hyun Ho Kim, Hwaseong-si (KR); So Young Lee, Suwon-si (KR); Cheol Jang, Uiwang-si (KR); Sun Young Jung, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 192 days.

This patent is subject to a terminal disclaimer.

(21) Appl. No.: 17/107,516

(22) Filed: Nov. 30, 2020

(65) Prior Publication Data
US 2021/0083228 A1      Mar. 18, 2021

Related U.S. Application Data

(63) Continuation of application No. 16/042,731, filed on Jul. 23, 2018, now Pat. No. 10,854,849.

(30) Foreign Application Priority Data

Sep. 20, 2017   (KR) ........................ 10-2017-0121282

(51) Int. Cl.
 G02B 5/18     (2006.01)
 H10K 50/85    (2023.01)
(Continued)

(52) U.S. Cl.
 CPC ......... H10K 50/85 (2023.02); G02B 27/4205 (2013.01); G09G 3/001 (2013.01);
(Continued)

(58) Field of Classification Search
 CPC ............ G02B 27/4205; G02B 27/0172; G02B 2027/0118; H01L 51/5262
(Continued)

(56) References Cited

U.S. PATENT DOCUMENTS 6,346,977 B1 *   2/2002   Westerman ....... G02F 1/133512
                                                        349/158
10,073,201 B2    9/2018   Ma et al.
(Continued)

FOREIGN PATENT DOCUMENTS

KR         101318072       10/2013
KR       1020150074169      7/2015
(Continued)

*Primary Examiner* — Audrey Y Chang
(74) *Attorney, Agent, or Firm* — CANTOR COLBURN LLP

(57) ABSTRACT

A display device comprising: a substrate; a plurality of display elements disposed on the substrate; and a diffraction pattern layer disposed on a path of light emitted from the plurality of display elements. The diffraction pattern layer comprises a plurality of diffraction patterns which is disposed with a predetermined pitch, and the plurality of diffraction patterns do not overlap the plurality of display elements; and when a width of a cross section of each of the plurality of diffraction patterns is defined as a length of each
(Continued)

diffraction pattern, the predetermined pitch and the length of each diffraction pattern satisfy the following inequation: $0.4 \leq d1/DP1 < 1$, where DP1 denotes the predetermined pitch, and d1 denotes the length of each diffraction pattern.

20 Claims, 32 Drawing Sheets

(51) Int. Cl.

| | | |
|---|---|---|
| G09G 3/3208 | (2016.01) | |
| G09G 3/00 | (2006.01) | |
| G02B 27/42 | (2006.01) | |
| H10K 50/81 | (2023.01) | |
| H10K 50/844 | (2023.01) | |
| H10K 50/858 | (2023.01) | |
| H10K 59/122 | (2023.01) | |
| G02B 27/01 | (2006.01) | |
| H10K 59/35 | (2023.01) | |

(52) U.S. Cl.
CPC ........... *G09G 3/3208* (2013.01); *H10K 50/81* (2023.02); *H10K 50/844* (2023.02); *H10K 50/858* (2023.02); *H10K 59/122* (2023.02); *G02B 27/0172* (2013.01); *G02B 2027/0118* (2013.01); *G09G 2300/0426* (2013.01); *G09G 2300/0439* (2013.01); *H10K 59/352* (2023.02); *H10K 59/353* (2023.02)

(58) Field of Classification Search
USPC .......................... 359/630, 572, 569; 349/122
See application file for complete search history.

(56) References Cited

U.S. PATENT DOCUMENTS

| | | | | |
|---|---|---|---|---|
| 10,854,849 | B2* | 12/2020 | Cho | .................. G02B 27/4205 |
| 2010/0026919 | A1* | 2/2010 | Yamauchi | ............ G03B 21/208 |
| | | | | 353/38 |
| 2012/0250303 | A1 | 10/2012 | Asaki et al. | |
| 2014/0118829 | A1 | 5/2014 | Ma et al. | |
| 2015/0241606 | A1* | 8/2015 | Kim | ......................... G02B 5/18 |
| | | | | 359/566 |
| 2016/0049612 | A1* | 2/2016 | Kim | .................... H01L 51/5268 |
| | | | | 257/88 |
| 2018/0314067 | A1 | 11/2018 | Cho et al. | |

FOREIGN PATENT DOCUMENTS

| | | |
|---|---|---|
| KR | 1020160021335 | 2/2016 |
| KR | 1020180121750 | 11/2018 |

* cited by examiner

DISPLAY DEVICE AND HEAD MOUNT DISPLAY DEVICE

This application is a continuation of U.S. patent application Ser. No. 16/042,731, filed on Jul. 23, 2018, which claims priority to Korean Patent Application No. 10-2017-0121282 filed on Sep. 20, 2017, and all the benefits accruing therefrom under 35 U.S.C. 119, the content of which in its entirety is herein incorporated by reference.

BACKGROUND

1. Field

The disclosure relates to a display device and a head mount display device.

2. Description of the Related Art

Display devices have been widely used with the development of multimedia. Recently, various types of display device, such as a liquid crystal display ("LCD"), an organic light-emitting diode ("OLED") display and the like, are being used.

Among the various types of display device, the OLED display displays an image using an OLED that generates light by recombining electrons and holes. The OLED display has a high response speed, a large luminance, and a wide viewing angle, and is also driven at low power consumption.

A head mount display device may be mounted on a user's head in the form of a pair of glasses, a helmet or the like. The head mount display device displays an image in front of the user's eyes so that the user may recognize the image.

SUMMARY

Embodiments of the disclosure relate to a display device capable of increasing an effective light emission area ratio, and a head mount display device.

Embodiments of the disclosure relate to a display device capable of minimizing a degree of visual blurring recognition, and a head mount display device.

Embodiments of the disclosure related to a head mount display device with reduced screen door effect ("SDE").

An exemplary embodiment of the invention is directed to a display device including: a substrate; a plurality of display elements disposed on the substrate; and a diffraction pattern layer disposed on a path of light emitted from the plurality of display elements. In such an embodiment, the diffraction pattern layer may include a plurality of diffraction patterns which is disposed with a predetermined pitch, and the plurality of diffraction patterns do not overlap the plurality of display elements. In such an embodiment, a width of a cross section of each of the plurality of diffraction patterns may be defined as a length of each diffraction pattern, the predetermined pitch, and the length of each diffraction pattern satisfy the following inequation: $0.4 \leq d1/DP1 < 1$, where $DP1$ denotes the predetermined pitch, and $d1$ denotes the length of each diffraction pattern.

Another exemplary embodiment of the invention is directed to a display device including: a substrate; a plurality of pixel electrodes disposed on the substrate; a pixel definition film disposed on the plurality of pixel electrodes, where a plurality of openings is defined in the pixel definition film to expose at least portions of the plurality of pixel electrodes; a plurality of organic light-emitting diodes ("OLED"s) disposed on the pixel definition film, wherein the plurality of OLEDs overlaps the plurality of openings; and a diffraction pattern layer including a plurality of diffraction patterns disposed on a path of light emitted from the plurality of OLEDs with a predetermined pitch. In such an embodiment, a region which overlaps the plurality of pixel electrodes may be defined as a display region, a region disposed in a periphery of the display region is defined as a non-display region, and the plurality of diffraction patterns is disposed in the non-display region. In such an embodiment, a width of a cross section of each of the plurality of diffraction patterns may be defined as a length of each diffraction pattern, and the predetermined pitch and the length of each diffraction pattern satisfy the following inequation: $0.4 \leq d1/DP1 < 1$, where $DP1$ denotes the predetermined pitch, and $d1$ denotes the length of each diffraction pattern.

Another exemplary embodiment of the invention is directed to a head mount display device including: a display unit including a plurality of display elements and a plurality of diffraction patterns disposed on a path of light emitted from the plurality of display elements; and a lens unit disposed on a path of light emitted from the display unit. In such an embodiment, the plurality of diffraction patterns may be disposed with a predetermined pitch and does not overlap the plurality of display elements. In such an embodiment, a width of a cross section of each of the plurality of diffraction patterns may be defined as a length of each diffraction pattern, and the predetermined pitch and the length of each diffraction pattern satisfy the following inequation: $0.4 \leq d1/DP1 < 1$, where $DP1$ denotes the predetermined pitch, and $d1$ denotes the length of each diffraction pattern.

BRIEF DESCRIPTION OF THE DRAWINGS

The above and other features of the invention will become more apparent by describing exemplary embodiments thereof in detail with reference to the attached drawings, in which.

DETAILED DESCRIPTION OF THE EMBODIMENTS

Figure 1:
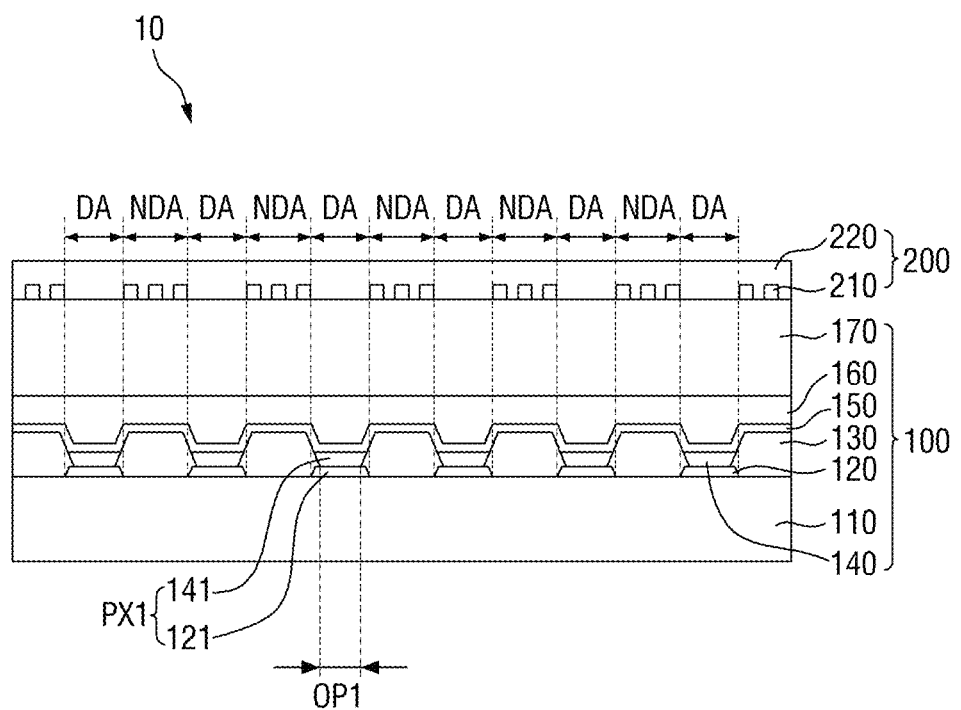
FIG. 1 is a cross-sectional view schematically illustrating a display device according to an exemplary embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. "Or" means "and/or." As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments will be described with reference to the accompanying drawings.

FIG. 1 is a cross-sectional view schematically illustrating a display device according to an exemplary embodiment of the disclosure.

Referring to FIG. 1, an exemplary embodiment of a display device 10 may include a display panel 100 and a diffraction pattern layer 200. Herein, a component may be formed through a continuous process with another component, the components formed through a continuous process is referred to as a "layer." That is, the diffraction pattern layer 200 may be formed on the display panel 100 through a continuous process. Herein, the display panel 100 and the diffraction pattern layer 200 are separated from each other for convenience of description. However, in an exemplary embodiment, the diffraction pattern layer 200 may be one component of the display panel 100.

Herein, a component which is coupled to another component through an adhesive member is expressed as a "panel." In a panel, a base layer providing a base surface may be included, while a base layer may be distinguished from other layers disposed thereon. That is, when a component is expressed as a "layer," it means that the component is disposed on a base surface provided by another component. Here, in an exemplary embodiment, a base layer may include a synthetic resin film, a composite material film, a glass substrate, or the like. Hereinafter, for convenience of description, exemplary embodiments where the diffraction pattern layer 200 is a diffraction panel will be described.

The display panel 100 is defined as a panel which displays an image. In an exemplary embodiment, the display panel 100 may include a plurality of display elements to display an image. In an exemplary embodiment, the plurality of display elements may be organic light-emitting diodes (OLEDs). In such an embodiment, the display panel 100 may be an OLED display panel. However, a type of the display panel 100 is not limited to the OLED display panel and may vary according to a type of the display element. In an alternative exemplary embodiment, the display panel 100 may be a quantum dot display panel, a liquid crystal display (LCD) panel, or the like, for example. Hereinafter, for convenience of description, an exemplary embodiment where the display panel 100 is an OLED display panel will be described in detail.

A first substrate 110 of the display panel 100 may be an insulating substrate. In an exemplary embodiment, the first substrate 110 may include a material such as glass, quartz, a polymer resin, or the like. In such an embodiment, the polymer material may be polyethersulphone ("PES"), polyacrylate ("PA"), polyarylate ("PAR"), polyetherimide ("PEI"), polyethylenenapthalate ("PEN"), polyethyleneterepthalate ("PET"), polyphenylenesulfide ("PPS"), polyallylate, polyimide ("PI"), polycarbonate ("PC"), cellulosetriacetate ("CAT"), cellulose acetate propionate ("CAP"), or a combination thereof. In an alternative exemplary embodiment, the first substrate 110 may be a flexible substrate including PI.

A plurality of pixel electrodes 120 may be disposed on the first substrate 110. Although not illustrated in the drawing, a plurality of components may be further disposed between the first substrate 110 and the plurality of pixel electrodes 120. In an exemplary embodiment, the plurality of components may include a buffer layer, a plurality of conductive interconnections, an insulating layer, a plurality of thin film transistors, or the like, for example. In an exemplary embodiment, amorphous silicon, polysilicon, low-temperature polysilicon ("LTPS"), an oxide semiconductor, an organic semiconductor, or the like may be used as a channel layer in the plurality of thin film transistors. Types of channel layers of the plurality of thin film transistors may be different from each other. In an exemplary embodiment, both of a thin film transistor including an oxide semiconductor, and a thin film transistor including LTPS may be included in a single pixel unit in consideration of a role or a process sequence of a thin film transistor.

The plurality of pixel electrodes 120, a pixel definition film 130, and a plurality of OLEDs 140 will be described on the basis of a first pixel electrode 121 and a first OLED 141 with reference to FIGS. 1 and 2.

Figure 2:
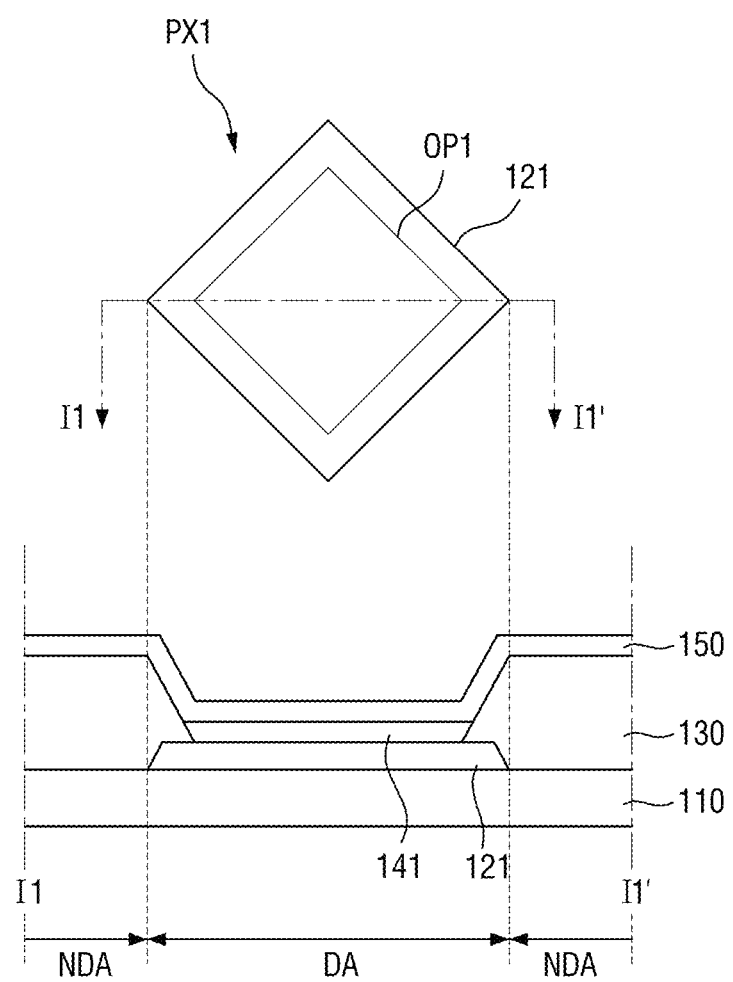
FIG. 2 shows plan and cross-sectional views illustrating a first pixel unit illustrated in FIG. 1.

FIG. 2 shows plan and cross-sectional views of a first pixel unit illustrated in FIG. 1.

Referring to FIGS. 1 and 2, in an exemplary embodiment, the first pixel electrode 121 may be an anode electrode. In such an embodiment, where the first pixel electrode 121 is an anode electrode, the first pixel electrode 121 may be a transparent electrode or semitransparent electrode, or an electrode including a reflective material such as aluminum, silver, chromium, or an alloy thereof. The transparent or translucent electrode may include at least one of indium tin oxide ("ITO"), indium zinc oxide ("IZO"), zinc oxide (ZnO), indium oxide ($In_2O_3$), indium gallium oxide ("IGO"), and aluminum zinc oxide ("AZO"). In an exemplary embodiment, the reflective material may include at least one of silver (Ag), magnesium (Mg), chromium (Cr), gold (Au), platinum (Pt), nickel (Ni), copper (Cu), tungsten (W), and aluminum (Al).

The pixel definition film 130 may be disposed on the plurality of pixel electrodes 120. A plurality of openings which expose at least portions of the plurality of pixel electrodes 120 is defined through the pixel definition film 130. In one exemplary embodiment, for example, an opening OP1 which exposes at least a portion of the first pixel electrode 121 is defined through the pixel definition film 130. The pixel definition film 130 may include an organic material or an inorganic material. In an exemplary embodiment, the pixel definition film 130 may include a material such as a photoresist, a polyimide resin, an acrylic resin, a silicon compound, a polyacrylic resin, or the like.

In an exemplary embodiment, the first pixel electrode 121 may have a diamond shape. In an exemplary embodiment, the opening OP1 of the pixel definition film 130 may also have a diamond shape. However, the shape of the first pixel electrode 121 and the shape of the opening OP1 of the pixel definition film 130 are not limited to those illustrated in FIG. 1. In such an embodiment, the shape of the first pixel electrode 121 and the shape of the opening OP1 of the pixel definition film 130 may be variously modified based on an arrangement structure of the plurality of pixel units and the like.

The plurality of OLEDs 140 may be disposed on the plurality of pixel electrodes 120 and the pixel definition film 130. The plurality of OLEDs 140 will be described on the basis of the first OLED 141. The first OLED 141 may be disposed in a region of the first pixel electrode 121, which is exposed through the opening OP1 of the pixel definition film 130. In such an embodiment, the first OLED 141 may overlap the opening OP1 of the pixel definition film 130. In an exemplary embodiment, the first OLED 141 may cover at least a portion of the opening OP1 of the pixel definition film 130.

In an exemplary embodiment, the first OLED 141 may emit one of a red light, a green light, and a blue light. A wavelength of the red light may be in a range from about 620 nanometers (nm) to 750 nm, and a wavelength of the green light may be in a range from about 495 nm to 570 nm. Also, a wavelength of the blue light may be in a range from about 450 nm to 495 nm.

In an alternative exemplary embodiment, the first OLED 141 may emit white light. In an exemplary embodiment, where the first OLED 141 emits white light, the first OLED 141 may have a structure in which a red light-emitting layer, a green light-emitting layer, and a blue light-emitting layer are stacked one on another, for example. The first OLED 141 may further include a separate color filter for displaying a red color, a green color or a blue color.

Although not illustrated in the drawings, the first OLED 141 may have a multilayer structure including a hole injection layer ("HIL"), a hole transport layer ("HTL"), an electron transport layer ("ETL"), an electron injection layer ("EIL"), and the like.

Referring back to FIG. 1, a common electrode 150 may be disposed on the first OLED 141 and the pixel definition film 130. In an exemplary embodiment, the common electrode 150 may be disposed on entire surfaces of the first OLED 141 and the pixel definition film 130. In an exemplary embodiment, the common electrode 150 may be a cathode electrode. In an exemplary embodiment, the common electrode 150 may include at least one of Li, Ca, LiF/Ca, LiF/Al, Al, Ag, and Mg. In an exemplary embodiment, the common electrode 150 may include a metal thin film having a low work function. In an exemplary embodiment, the common electrode 150 may be a transparent or translucent electrode including at least one of ITO, IZO, ZnO, indium oxide ($In_2O_3$), IGO, and AZO.

A first buffer layer 160 may be disposed on the common electrode 150. In such an embodiment, a material of the first buffer layer 160 is not particularly limited. In an exemplary embodiment, the first buffer layer 160 may include an inorganic material or an organic material. Alternatively, the first buffer layer 160 may have a single layer structure including one of an organic layer and an inorganic layer or a multilayer structure in which one or more layers of an organic layer and an inorganic layer are stacked one on another. In an alternative exemplary embodiment, the first buffer layer 160 may be an air layer. In another alternative exemplary embodiment, the first buffer layer 160 may be omitted.

In an exemplary embodiment, although not illustrated in the drawings, a capping layer may be disposed on the common electrode 150. The capping layer may effectively prevent light incident on the common electrode 150 from being totally reflected. In an exemplary embodiment, the capping layer may include an organic film or an inorganic film. In an exemplary embodiment, the first buffer layer 160 may serve as the capping layer.

A first encapsulation layer 170 may be disposed on the first substrate 110 to cover the plurality of OLEDs 140. In an exemplary embodiment, the plurality of OLEDs 140 may be disposed between the first substrate 110 and the first encapsulation layer 170. The first encapsulation layer 170 may block external oxygen and moisture from the plurality of OLEDs 140.

In an exemplary embodiment, the first encapsulation layer 170 may be a transparent insulating substrate. The first encapsulation layer 170 may be a glass substrate, a quartz substrate, a transparent resin substrate, or the like. A sealing member may be provided between the first encapsulation layer 170 and the first substrate 110 to bond the first encapsulation layer 170 and the first substrate 110.

The diffraction pattern layer 200 may be disposed on the display panel 100. In an exemplary embodiment, the diffraction pattern layer 200 may be disposed on a path of light emitted from the plurality of OLEDs 140. In one exemplary embodiment, for example, the diffraction pattern layer 200 may be directly disposed on the first encapsulation layer 170.

The diffraction pattern layer 200 may include a plurality of diffraction patterns 210 and a protective layer 220.

The plurality of diffraction patterns 210 may be disposed on the first encapsulation layer 170. In such an embodiment, the first encapsulation layer 170 may provide a base surface for the plurality of diffraction patterns 210. The plurality of diffraction patterns 210 may protrude in an upward direction (on the basis of FIG. 1) of the first encapsulation layer 170. Here, the upward direction of the first encapsulation layer 170 is defined as a direction of the path of the light emitted from the plurality of OLEDs 140.

The plurality of diffraction patterns 210 may diffract the light emitted from the plurality of OLEDs 140 to enlarge an effective light emission area. In an exemplary embodiment, the diffraction of the light may occur due to an interference phenomenon between light provided to the plurality of diffraction patterns 210 and light provided to a region between the plurality of diffraction patterns 210 (i.e., a region of the first encapsulation layer 170 not protruding in the upward direction). In such an embodiment, the plurality of diffraction patterns 210 are patterns protruding in the upward direction of the first encapsulation layer 170, which are defined for convenience of description, and the diffraction of the light may occur not only in the plurality of diffraction patterns 210, but also in other layers or components. Hereinafter, the diffraction phenomenon of light will be described on the basis of the plurality of diffraction patterns 210. A definition of the effective light emission area and an enlargement of the effective light emission area will be described below.

The plurality of diffraction patterns 210 is not disposed in a display region DA, that is, the plurality of diffraction patterns 210 does not overlap the display region DA. Here, the display region DA is defined as a region which overlaps the plurality of pixel electrodes 120. Herein, since the display region DA is defined as the region which overlaps the plurality of pixel electrodes 120, the display region DA overlaps the plurality of OLEDs 140. Herein, "a first component and a second component overlap" means that the first component and the second component overlap in a thickness direction of the first substrate 110 or a direction perpendicular to the first substrate 110. In an exemplary embodiment, the display region DA overlaps the plurality of OLEDs 140 and is a region in which light is generated.

The plurality of diffraction patterns 210 may be disposed in a non-display region NDA or to overlap the non-display region NDA. The non-display region NDA is defined as a region which is located in a periphery of the display region DA and does not generate light. Also, the non-display region NDA and the display region DA do not overlap each other. Accordingly, the non-display region NDA may also be defined as a region which does not overlap the plurality of pixel electrodes 120.

In FIG. 1, the display region DA and the non-display region NDA are arbitrarily divided to describe the arrangement of the plurality of diffraction patterns 210. Accordingly, when the non-display region NDA does not overlap the plurality of OLEDs 140, a boundary between the display region DA and the non-display region NDA is not limited to that illustrated in FIG. 1. Hereinafter, the boundary between the display region DA and the non-display region NDA are defined on the basis of the plurality of pixel electrodes 120. That is, the display region DA is defined as a region which overlaps the plurality of pixel electrodes 120 and the non-display region NDA is defined as a region which does not overlap the plurality of pixel electrodes 120.

The protective layer 220 may be disposed on the plurality of diffraction patterns 210. In an exemplary embodiment, the protective layer 220 may be disposed to cover the plurality of diffraction patterns 210. In such an embodiment, a material of the protective layer 220 is not particularly limited. In an exemplary embodiment, the protective layer 220 may include an organic film or an inorganic film. In such an embodiment, the organic film may include at least one of an acrylic resin, a methacrylic resin, a polyisoprene resin, a vinyl resin, an epoxy resin, a urethane resin, a cellulose resin, a siloxane resin, a polyimide resin, a polyamide resin, and a perylene resin. In such an embodiment, the inorganic film may include at least one of aluminum oxide, titanium oxide, silicon oxide, silicon oxynitride, zirconium oxide, and hafnium oxide.

In an alternative exemplary embodiment, the protective layer 220 may include an adhesive material for bonding with a component disposed on the diffraction pattern layer 200. In such an embodiment, a type of the adhesive material is not particularly limited. In an exemplary embodiment, where the protective layer 220 includes an adhesive material, the protective layer 220 may be a pressure-sensitive adhesive ("PSA"), an optically clear adhesive ("OCA"), or an optically clear resin ("OCR") film.

In such an embodiment, a method of forming the diffraction pattern layer 200 is not particularly limited. In an exemplary embodiment, the diffraction pattern layer 200 may be formed through an etching process after an inorganic layer is formed on the first encapsulation layer 170. In such an embodiment, the inorganic layer may include at least one of silicon oxide ($SiO_x$), silicon nitride ($SiN_x$), and silicon oxynitride ($SiON_x$). In such an embodiment, the etching process may be a dry etching process, but not being limited thereto.

Next, pitch and an arrangement form of the plurality of diffraction patterns 210 will be described in greater detail with reference to FIGS. 3 and 4.

Figure 3:
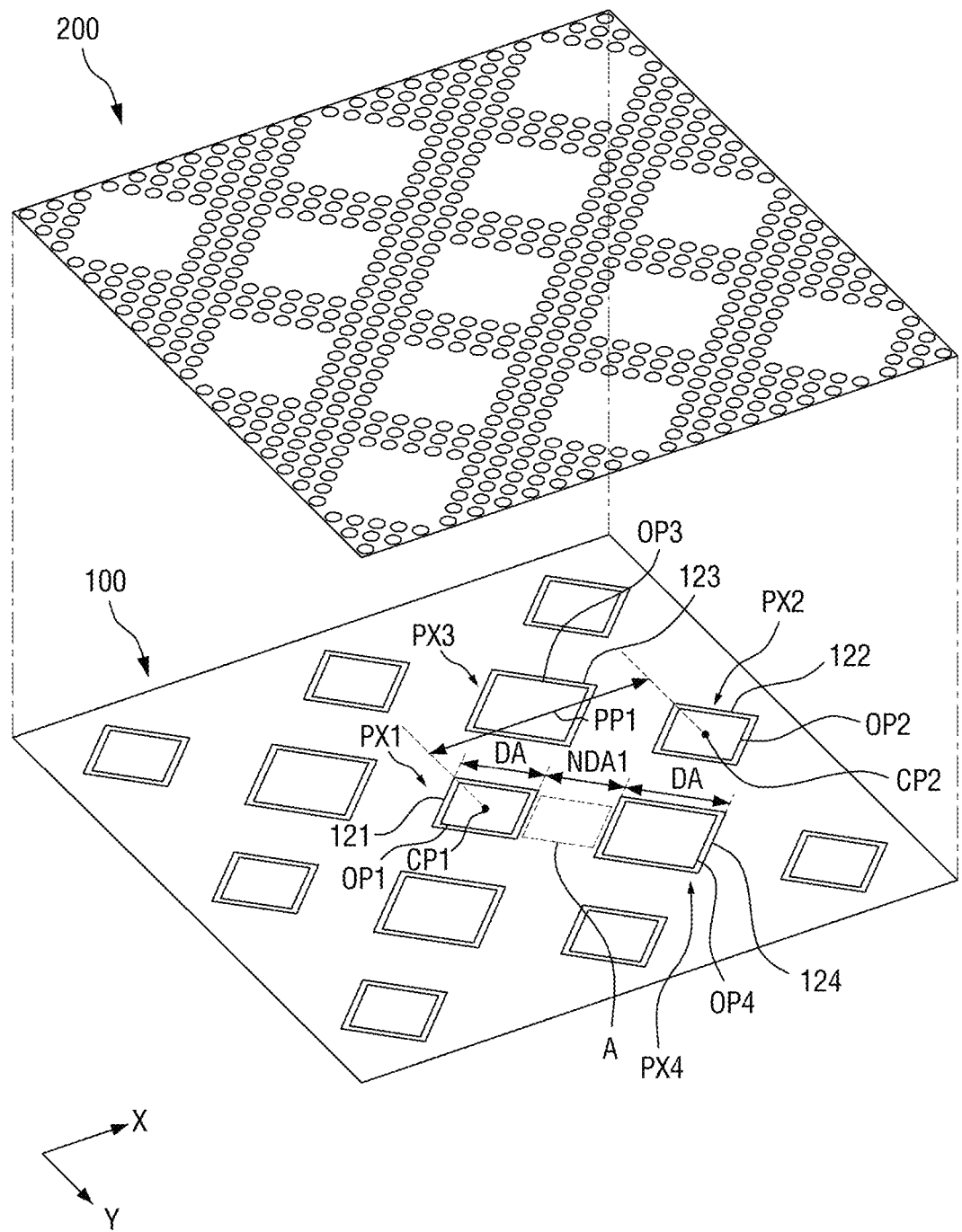
FIGS. 3 and 4 are views illustrating a relationship between a plurality of diffraction patterns and an arrangement structure of a plurality of pixel units illustrated in FIG. 1.
Figure 4:
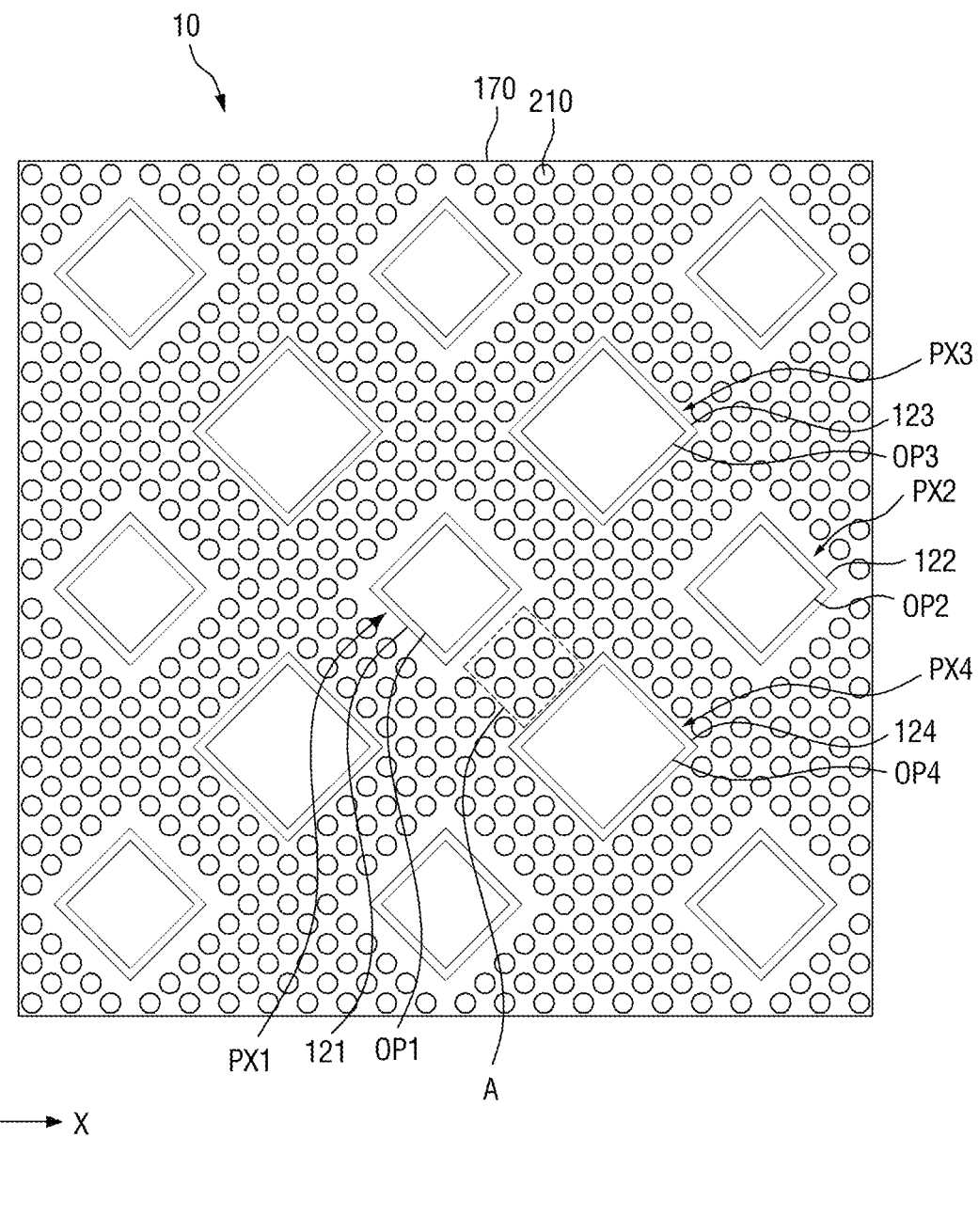

FIGS. 3 and 4 are views illustrating a relationship between the plurality of diffraction patterns and an arrangement structure of the plurality of pixel units illustrated in FIG. 1.

First, the arrangement structure of the plurality of pixel units included in the display panel 100 will be described on the basis of first to fourth pixel units PX1 to PX4.

The first pixel unit PX1 may be disposed to be adjacent to the second pixel unit PX2 in a first direction X. The third pixel unit PX3 may be disposed to be adjacent to the fourth pixel unit PX4 in a second direction Y. Accordingly, the first pixel unit PX1 may be disposed to be adjacent to the third and fourth pixel units PX3 and PX4 in a diagonal direction. In such an embodiment, the first to fourth pixel units PX1 to PX4 may be disposed in a diamond shape. Although all of the first to fourth pixel units PX1 to PX4 are illustrated as having a diamond shape in FIGS. 3 and 4, the shapes and sizes of the first to fourth pixel units PX1 to PX4 are not limited to those illustrated in FIGS. 3 and 4. Here, the first direction X is defined as a row direction with reference to FIGS. 3 and 4. The second direction Y is defined as a column direction perpendicular to the first direction X with reference to FIGS. 3 and 4.

In an exemplary embodiment, the first and second pixel units PX1 and PX2 may display a green color. In such an embodiment, the first and second pixel units PX1 and PX2 may include a green OLED which emits a green light. In such an embodiment, the third pixel unit PX3 may display a red color, and the fourth pixel unit PX4 may display a blue color. In such an embodiment, the third pixel unit PX3 may include a red OLED which emits a red light, and the fourth pixel unit PX4 may include a blue OLED which emits a blue light.

The first to fourth pixel units PX1 to PX4 may constitute one unit pixel unit. In such an embodiment, the first to fourth pixel units PX1 to PX4 may be disposed in an RGBG PenTile manner. However, an arrangement relationship of the first to fourth pixel units PX1 to PX4 constituting the unit pixel unit is not limited to that illustrated in FIGS. 3 and 4. In an exemplary embodiment, the arrangement relationship of the first to fourth pixel units PX1 to PX4 constituting the unit pixel unit may be variously modified based on display colors of the pixel units, applied resolution and aperture ratio of the display device 10, and the like.

The first to fourth pixel units PX1 to PX4 may include first to fourth pixel electrodes 121 to 124, respectively. In an exemplary embodiment, the first to fourth pixel electrodes 121 to 124 may have a diamond shape. Here, the diamond shape includes a rhombus shape and a shape similar thereto in consideration of process conditions and the like.

At least portions of the first to fourth pixel electrodes 121 to 124 are exposed by the pixel definition film 130 (see FIG. 1). In such an embodiment, first to fourth openings OP1 to OP4, which expose at least portions of the first to fourth pixel electrodes 121 to 124, respectively, are defined through the pixel definition film 130.

The display region DA includes a region which overlaps the first to fourth pixel electrodes 121 to 124. The non-display region NDA is defined as a region which does not overlap the plurality of pixel electrodes 120 (see FIG. 1) including the first to fourth pixel electrodes 121 to 124. The non-display region NDA may include a first non-display region NDA1 disposed in a region A between the first pixel electrode 121 and the fourth pixel electrode 124. Hereinafter, a shape and pitch of the plurality of diffraction patterns 210 will be described in greater detail with reference to FIGS. 5 to 7 on the basis of the first non-display region NDA1 disposed in the region A. A distance PP1 between pixels will be described later with reference to FIG. 8.

Figure 5:
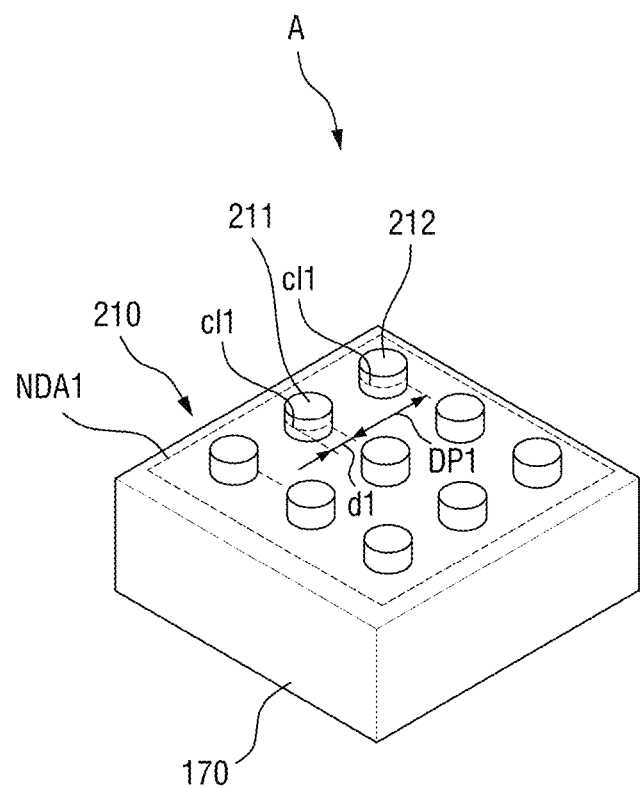
FIG. 5 is a perspective view illustrating a plurality of diffraction patterns disposed in region A illustrated in FIGS. 3 and 4.
Figure 6:
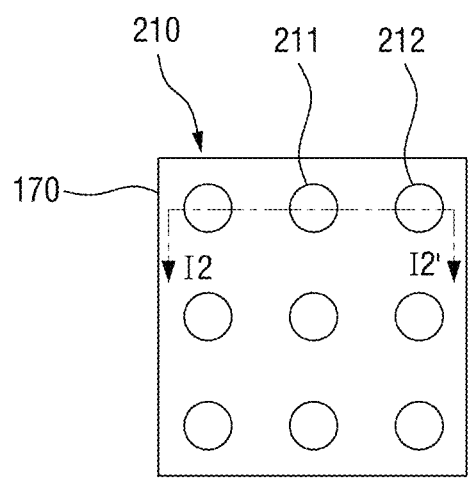
FIG. 6 is a plan view illustrating the plurality of diffraction patterns disposed in region A illustrated in FIGS. 3 and 4.
Figure 7:
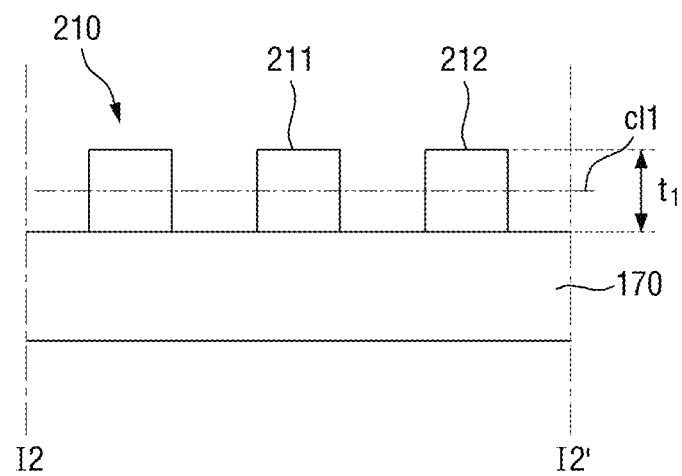
FIG. 7 is a cross-sectional view taken along line I2-I2' of FIG. 6.

FIG. 5 is a perspective view illustrating the plurality of diffraction patterns disposed in the region A illustrated in FIGS. 3 and 4. FIG. 6 is a plan view illustrating the plurality of diffraction patterns disposed in the region A illustrated in FIGS. 3 and 4. FIG. 7 is a cross-sectional view taken along line I2-I2' of FIG. 6.

First, shapes of the plurality of diffraction patterns 210 will be described.

Referring to FIGS. 1 and 5 to 7, in an exemplary embodiment, each of the plurality of diffraction patterns 210 may have a cylindrical shape. In such an embodiment, shapes of upper surfaces and lower surfaces of the plurality of diffraction patterns 210 may have a circular shape. Here, the circular shape is a concept including a circle and a shape similar to a circle in consideration of process conditions and the like when viewed from a top plan view. Here, the shape similar to a circle may include an elliptical shape or a polygonal shape that is substantially similar to a circle, for example. However, the shapes of the plurality of diffraction patterns 210 are not limited to those illustrated in FIG. 3.

In such an embodiment, as shown in FIG. 7, the plurality of diffraction patterns 210 may have a rectangular shape in a cross-sectional view thereof. The rectangular shape is a concept including a rectangular shape and a shape similar to a rectangular shape in consideration of process conditions and the like in a cross-sectional view thereof. A size of the rectangular shape and the number of diffraction patterns disposed in the first non-display region NDA1 are not limited to those illustrated in FIG. 1.

Next, the pitch of the plurality of diffraction patterns 210 will be described.

The plurality of diffraction patterns 210 may be arranged uniformly in the first direction X, e.g., disposed with a constant pitch or interval in the first direction X. In such an embodiment, as described above, the plurality of diffraction patterns 210 may be disposed only in the non-display region NDA. In such an embodiment, the plurality of diffraction patterns 210 may be arranged uniformly in the first direction X in the non-display region NDA, e.g., disposed with a constant pitch or interval in the first direction X in the non-display region NDA. Here, the pitch refers to a distance between centers or same sides of two adjacent diffraction patterns in a plurality of non-display regions NDA.

The plurality of diffraction patterns 210 may include a first diffraction pattern 211 and a second diffraction pattern 212, which are disposed in the first non-display region NDA1 to be adjacent to each other in the first direction X. The first diffraction pattern 211 and the second diffraction pattern 212 may be disposed to have a first pitch DP1.

In an exemplary embodiment, the plurality of diffraction patterns 210 may be disposed to have the first pitch DP1 in the second direction Y. In an alternative exemplary embodiment, a pitch between the diffraction patterns disposed in the first direction X may be different from a pitch between the diffraction patterns disposed in the second direction Y. In an exemplary embodiment, the number of the diffraction patterns disposed in the first direction X may be different from the number of the diffraction patterns disposed in the second direction Y. The number of the diffraction patterns is not limited to those illustrated in FIGS. 5 and 6, and may be variously modified based on the arrangement structure of the pixel units, the type of the light emission color, the size of the display panel 100, and the like.

In an exemplary embodiment, as shown in FIG. 7, the first diffraction pattern 211 and the second diffraction pattern 212 may have a first thickness t1. The first thickness t1 refers to a distance from a lower surface of each of the plurality of diffraction patterns 210 (or an upper surface of the first encapsulation layer 170) to an upper surface thereof with reference to FIG. 7. The first thickness t1 will be described later in greater detail.

In an exemplary embodiment, the first diffraction pattern 211 and the second diffraction pattern 212 may have a first length d1. The first length d1 together with the above-described first pitch DP1 are defined on the basis of a cross section of each of the plurality of diffraction patterns 210. This will hereinafter be described in greater detail with reference to FIG. 8.

Figure 8:
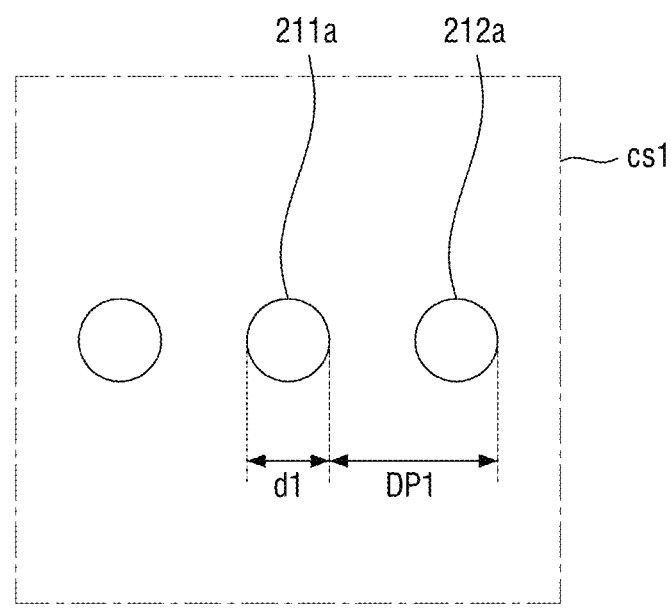
FIG. 8 is a view illustrating a cross-sectional region taken along an imaginary line illustrated in FIG. 7.

FIG. 8 is a view illustrating a cross-sectional region taken along an imaginary line illustrated in FIG. 7. More specifically, FIG. 8 illustrates a cross-sectional region cs1 taken along a first imaginary line cl1 illustrated in FIG. 7. Here, the first imaginary line cl1 refers to a line passing through half of the first thickness t1 of each of the plurality of diffraction patterns 210 including the first diffraction pattern 211 and the second diffraction pattern 212. Reference numeral 211a refers to a cross section of the first diffraction pattern 211 taken along the first imaginary line cl1. Reference numeral 212a refers to a cross section of the second diffraction pattern 212 taken along the first imaginary line cl1.

Referring to FIG. 8, the first pitch DP1 is defined as a distance from one side of the cross section 211a of the first diffraction pattern 211 to one side of the cross section 212a of the second diffraction pattern 212. The first length d1 refers to a width of the cross section 211a of the first diffraction pattern 211. As described above, although the first pitch DP1 and the first length d1 are described on the basis of the first diffraction pattern 211 and the second diffraction pattern 212 in FIG. 8, each of the plurality of diffraction patterns 210 including the first diffraction pattern 211 and the second diffraction pattern 212 may also have the first pitch DP1 and the first length d1. In such an embodiment, the first pitch DP1 and the first length d1 of the plurality of diffraction patterns 210 are also defined on the basis of the cross sections of the plurality of diffraction patterns 210 taken along the first imaginary line cl1.

All of the first pitch DP1, the first length d1 and the first thickness t1 may affect the above-described effective light emission area. Hereinafter, the definition of the effective light emission area and the enlargement of the effective light emission area will be described with reference to FIG. 9.

Figure 9:
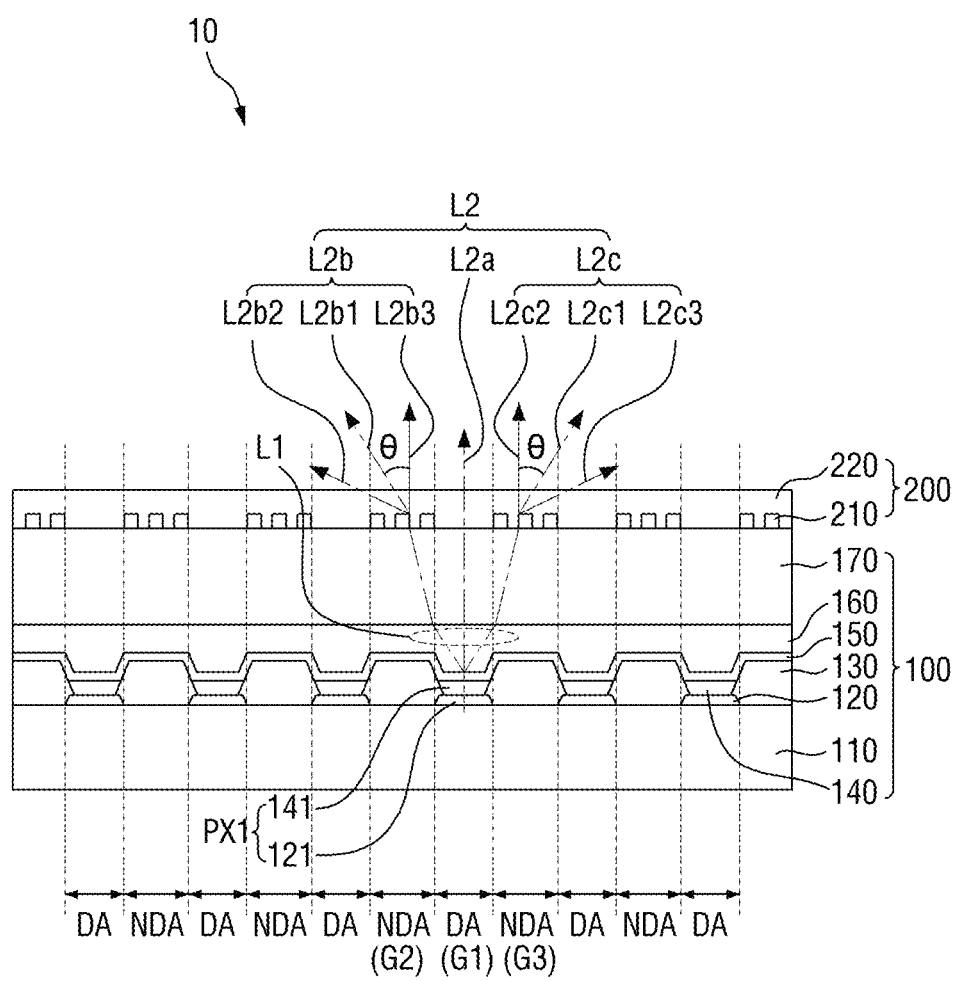
FIGS. 9, 10A and 10B are views for describing an enlargement of an effective light emission area of the display device according to an exemplary embodiment of the disclosure.

FIGS. 9 and 10 are views for describing the enlargement of the effective light emission area of the display device according to an exemplary embodiment of the disclosure. For convenience of description, the enlargement will be described on the basis of the first pixel electrode 121 and the first OLED 141, which are included in the first pixel unit PX1 shown in FIG. 2. Here, a region of the display region DA which overlaps the first pixel electrode 121 is referred to as a first region G1. Also, regions of the non-display region NDA, which are adjacent to the first region G1 are referred to as a second region G2 and a third region G3.

First, referring to FIG. 9, light L1 emitted from the first OLED 141 may be provided to the first encapsulation layer 170. In an exemplary embodiment, a path of at least a portion of the light L1 emitted from the first OLED 141 may be changed to a predetermined angle by a difference between a refractive index of the first encapsulation layer 170 and a refractive index of the first buffer layer 160. Alternatively, when the refractive index of the first encapsulation layer 170 is equal to the refractive index of the first buffer layer 160, the path of the light L1 emitted from the first OLED 141 may not be changed.

The light passed through the first encapsulation layer 170 may pass further through the diffraction pattern layer 200.

The diffraction pattern layer 200 may diffract the light passed through the first encapsulation layer 170 and generate first diffracted light L2a, second diffracted light L2b, and third diffracted light L2c. Here, the first diffracted light L2a, the second diffracted light L2b and the third diffracted light L2c are components or portions of diffracted light L2 distinguished based on a region. The first diffracted light L2a is defined as light emitted to the first region G1, the second diffracted light L2b is defined as light passing through a plurality of diffraction patterns 210 disposed in the second region G2, and the third diffracted light L2c is defined as light passing through a plurality of diffraction patterns 210 disposed in the third region G3.

The first diffracted light L2a may have a light path in a direction perpendicular to the first substrate 110 without changing the light path. That is, since the first diffracted light L2a has the light path in the direction perpendicular to the first substrate 110, the first diffracted light L2a may be emitted to the outside without being in contact with the plurality of diffraction patterns 210. That is, the first diffracted light L2a not diffracted is defined as zero-order diffracted light in which a light path before diffraction is the same as a light path after diffraction.

The second diffracted light L2b and the third diffracted light L2c may include zero-order diffracted light and first-order diffracted light, respectively. Here, the first-order diffracted light refers to light having a diffraction angel θ on the basis of the zero-order diffracted light and in which a light path is changed by passing through the plurality of diffraction patterns 210.

Therefore, in the display region DA including the first region G1, a light emission pattern may be formed using the zero-order diffracted light. In the non-display region NDA including the second region G2 or the third region G3, light may be diffracted through the plurality of diffraction patterns 210 to increase the effective light emission area. Therefore, luminous efficiency may be improved.

Referring to FIG. 9, for example, each of reference numerals L2b1, L2a, and L2c1 refers to zero-order diffracted light. Also, each of reference numerals L2b2, L2b3, L2a2, L2a3, L2c2, and L2c3 refers to first-order diffracted light. In an alternative exemplary embodiment, the second diffracted light L2b and the third diffracted light L2c may further include second or more order diffracted light. For convenience of description, an exemplary embodiment where the second diffracted light L2b and the third diffracted light L2c including zero-order diffracted light and first-order diffracted light will be described.

In an exemplary embodiment, the first diffracted light L2a, the second diffracted light L2b, and the third diffracted light L2c may include effective light. The effective light is defined as light having a light path in a direction perpendicular to the first substrate 110. Here, the direction perpendicular to the first substrate 110 may not be limited to a direction of 90 degrees with respect to the first substrate 110. The light having a light path in the direction perpendicular to the first substrate 110 may mean light having a light path in has a substantially vertical direction and that may affect the enlargement of the above-described effective light emission area. In such an embodiment, there are no limitations on the order of the diffracted light to be included in the effective light. That is, the effective light may include both of the zero-order diffracted light and the first-order diffracted light as long as light has a component traveling in a light path in the vertical direction.

Reference numerals L2a, L2b3, and L2c2 satisfy the definition of the effective light. Hereinafter, reference numerals L2a, L2b3, and L2c2 will be referred to as first effective light L2a, second effective light L2b3, and third effective light L2c2. The first effective light L2a, the second effective light L2b3, and the third effective light L2c2 may affect the enlargement of the effective light emission area. This will be described with reference to FIGS. 10A and 10B.

Figure 10A:
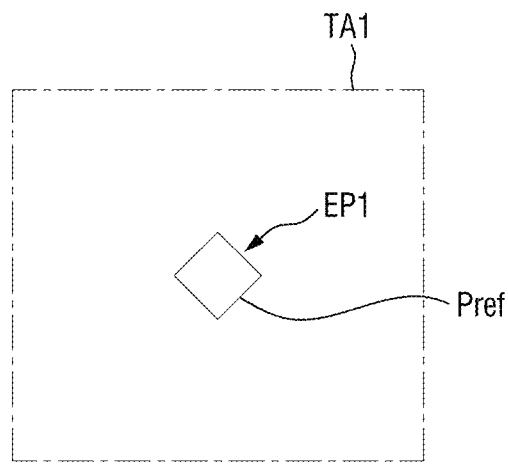

Referring to FIG. 10A, a light emission pattern generated in a first light emission region TA1 by the light L1 emitted from the first OLED 141 is defined as a first light emission pattern EP1. The first light emission pattern EP1 may also be defined as a light emission pattern generated by the light L1 emitted from the first OLED 141 in a display device not including the diffraction pattern layer 200. Here, the first light emission region TA1 may have a same area as a second light emission region TA2 to be described below. The first light emission pattern EP1 may include a reference light emission pattern Pref.

Figure 10B:
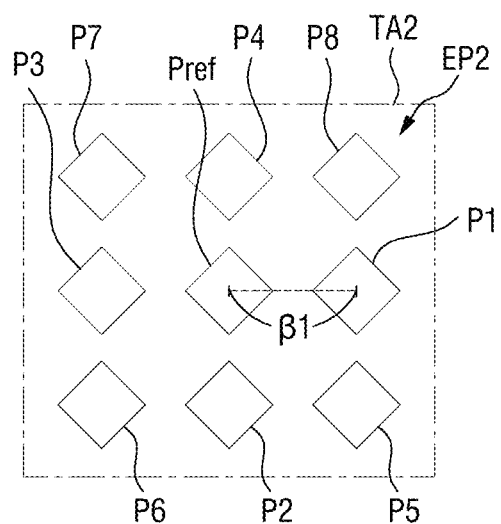

Referring to FIG. 10B, a light emission pattern, which is generated in the second light emission region TA2 by the first effective light L2a, the second effective light L2b3 and the third effective light L2c2 among the first diffracted light L2a, the second diffracted light L2b, and the third diffracted light L2c passing though the diffraction pattern layer 200, is defined as a second light emission pattern EP2. The second light emission pattern EP2 may include the reference light emission pattern Pref and a plurality of replicated light emission patterns P1 to P8 replicated from the reference light emission pattern Pref. However, luminance of the reference light emission pattern Pref and luminances of the plurality of replicated light emission patterns P1 to P8 may be different.

As described above, an area of the first light emission region TA1 and an area of the second light emission region TA2 are the same as each other. However, the number of light emission patterns included in the second light emission region TA2 is greater than the number of light emission patterns included in the first light emission region TA1. This means that a light emission area of the second light emission region TA2 is greater than a light emission area of the first light emission region TA1. That is, a region of the second light emission region TA2, in which light is not emitted (i.e., a non-emission region), may be expressed as having a smaller area than that of the first light emission region TA1.

A large area of the light emission region may be expressed as an enlarged light emission area or a large light emission area ratio. Here, the light emission area ratio is defined as a ratio of a total area of light emission patterns existing in a unit region to an area of the unit region. Light emission patterns for calculating the light emission area ratio may include all of a reference light emission pattern and replicated light emission patterns. As shown in FIGS. 10A and 10B, the second light emission region TA2 includes nine light emission patterns including the reference light emission pattern Pref and the plurality of replicated light emission patterns P1 to P8 while the first light emission region TA1 includes only the reference light emission pattern Pref. Accordingly, a light emission area ratio of the second light emission region TA2 is greater than a light emission area ratio of the first light emission region TA1. This means that the light emission area of the second light emission region TA2 may be expressed as being enlarged compared to the light emission area of the first light emission region TA1.

However, luminance of the replicated light emission pattern may be used as a factor for calculating the light emission area ratio only when the luminance of the replicated light emission pattern is about 3% or greater of luminance of the reference light emission pattern. Hereinafter, the sum of an area of the reference light emission pattern and areas of the replicated light emission patterns, which are replicated from the reference light emission pattern and satisfy about 3% or more of the luminance of the reference light emission pattern, in one region is defined as the effective light emission area. Also, a ratio of the effective light emission area to an area in one region is defined as an effective light emission area ratio. For example, replicated light emission patterns for calculating the effective light emission area ratio may be limited to patterns having about 3% or greater of the luminance of the reference light emission pattern among the replicated light emission patterns. This means that the luminance of the plurality of replicated light emission patterns P1 to P8 may be used as a factor for calculating the effective light emission area ratio when the luminance of the plurality of replicated light emission patterns P1 to P8 is about 3% or greater of the luminance of the reference light emission pattern Pref.

An increase of the effective light emission area ratio will hereinafter be described with reference to FIGS. 11A and 11B.

Figure 11A:
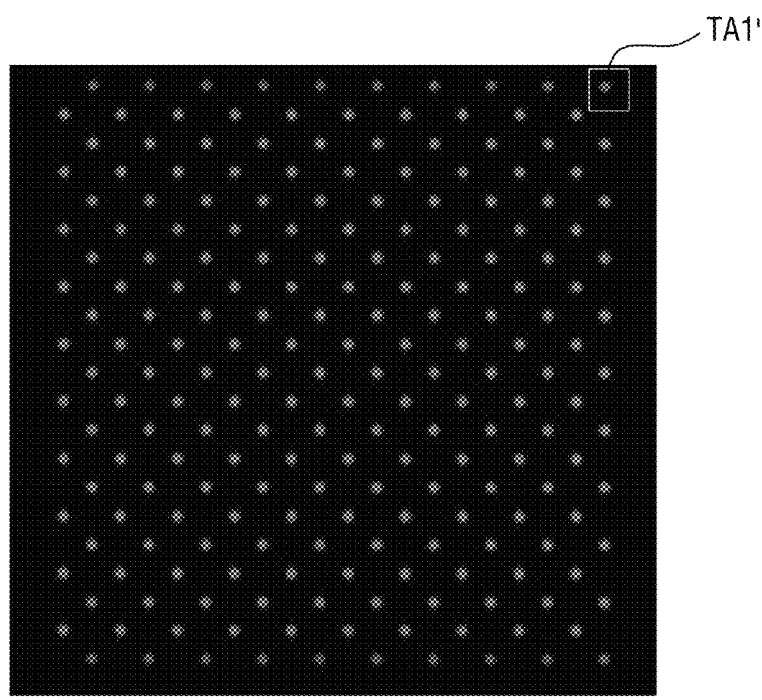
FIGS. 11A and 11B are views for describing an increase of an effective light emission area ratio in the display device according to an exemplary embodiment of the disclosure.
Figure 11B:
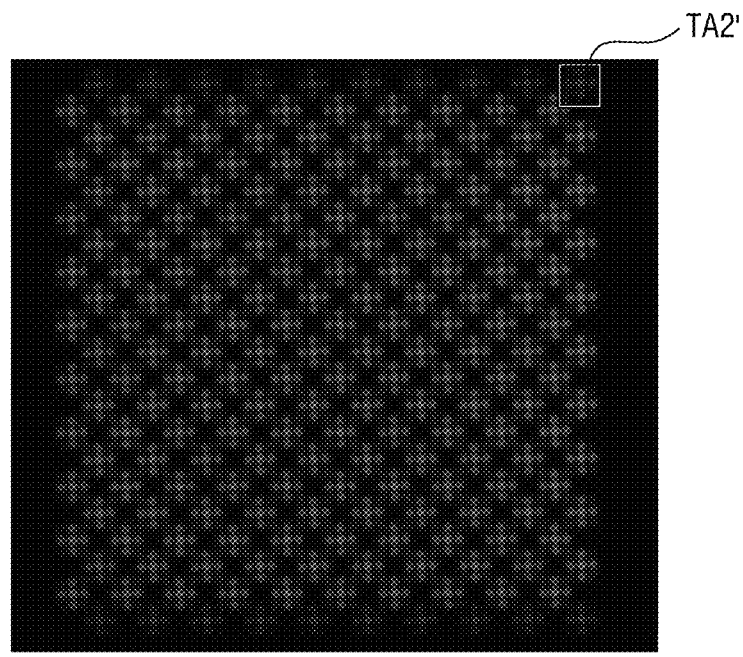

FIGS. 11A and 11B show views for describing an increase of the effective light emission area ratio in the display device according to an exemplary embodiment of the disclosure. Here, FIG. 11A illustrates light emission patterns when the diffraction pattern layer 200 is not included or when light does not pass through the diffraction pattern layer 200, and FIG. 11B illustrates light emission patterns after light passes through the diffraction pattern layer 200. A region TA1' may correspond to the first light emission region TA1 in FIG. 10A. Also, a region TA2' illustrated in FIG. 11B may correspond to the second light emission region TA2 in FIG. 10B. Hereinafter, the regions TA1' and TA2' having the same area will be described.

Referring to FIGS. 11A and 11B, the number of light emission patterns in a second light emission region TA2' is greater than the number of light emission patterns in a first light emission region TA1'. This means that the effective light emission area ratio is increased because the light emission region is increased in a unit area. In an exemplary embodiment, as described above, the display device may diffract the light L1 emitted from the plurality of OLEDs 140 to increase the effective light emission area ratio. In such an embodiment, the effective light emission area ratio is increased, and thus luminous efficiency of the light L1 emitted from the plurality of OLEDs 140 may be improved.

Next, factors for calculating the effective light emission area ratio, that is, factors used to determine whether luminance of at least one of the plurality of replicated light emission patterns P1 to P8 satisfies about 3% or greater of the luminance of the reference light emission pattern Pref, will be described with reference to FIGS. 12 and 13.

Figure 12:
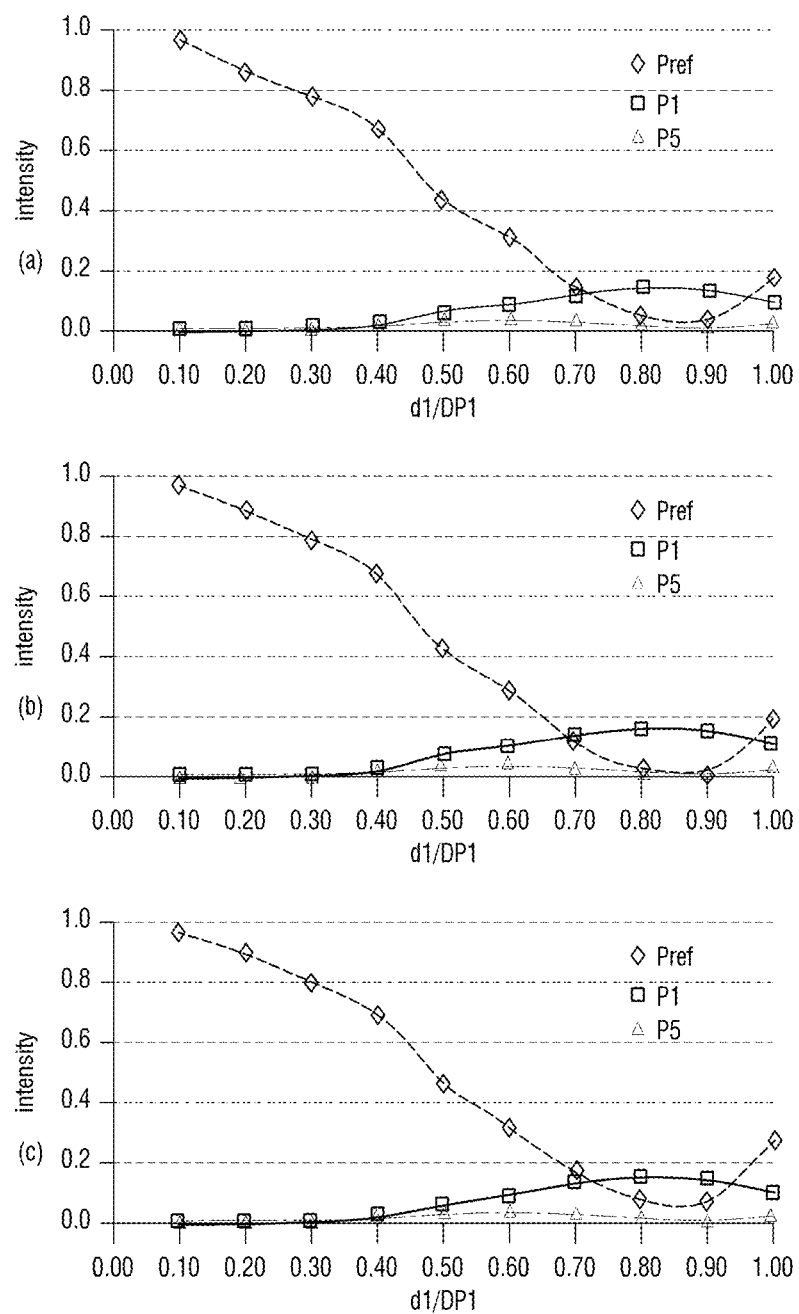
FIG. 12 shows graphs illustrating luminance according to a value of d1/DP1 for each light emission color of an organic light-emitting diode ("OLED")

FIG. 12 shows graphs illustrating luminance according to a value of d1/DP1 for each light emission color of an organic light-emitting diode ("OLED. The graph (a) in FIG. 12 is a graph illustrating luminance according to a value of d1/DP1 when an OLED emits blue light. The graph (b) in FIG. 12 is a graph illustrating luminance according to a value of d1/DP1 when an OLED emits green light. The graph (c) in FIG. 12 is a graph illustrating luminance according to a value of d1/DP1 when an OLED emits red light.

Figure 13:
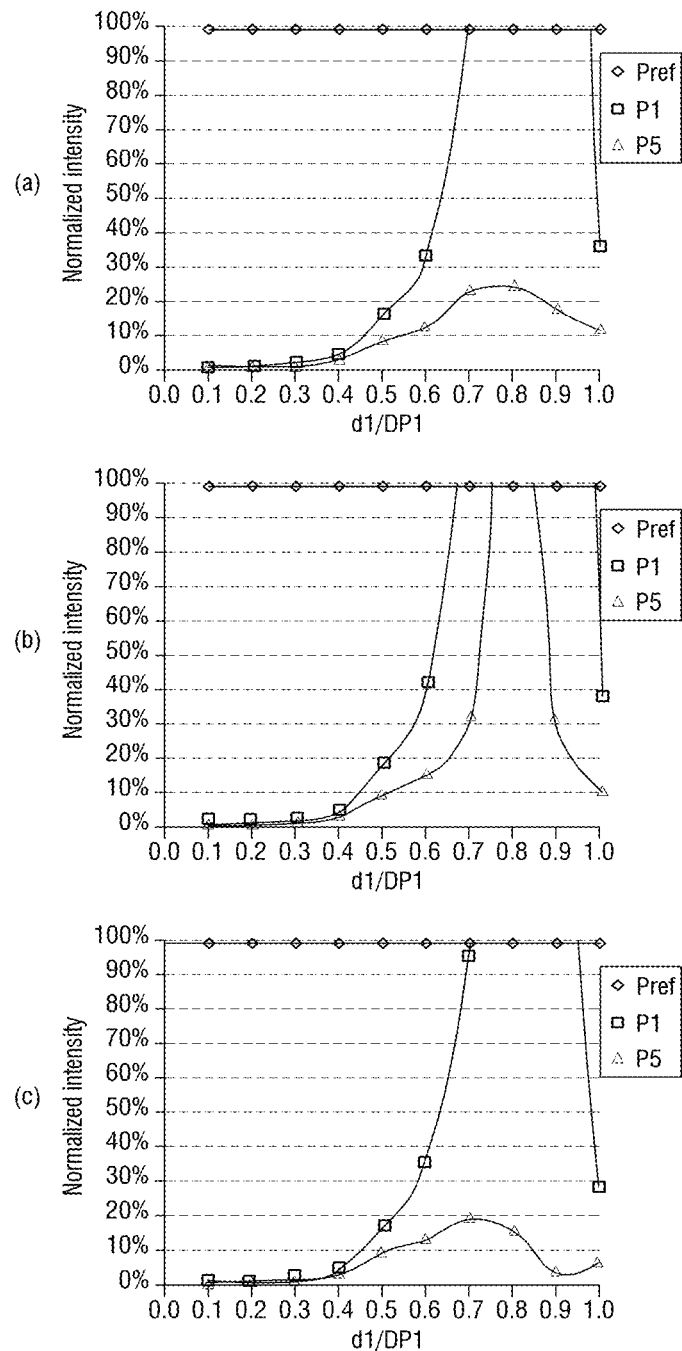
FIG. 13 shows graphs obtained by normalizing luminance of a first replicated light emission pattern and luminance of a fifth replicated light emission pattern on the basis of luminance of a reference light emission pattern (Pref) illustrated in FIG. 12.

FIG. 13 are graphs obtained by normalizing the luminances of the first replicated light emission pattern P1 and the fifth replicated light emission pattern P5 on the basis of the luminance of the reference light emission pattern Pref illustrated in FIG. 12. Intensity of each graph in FIG. 12 refers to intensity of the luminance.

The first diffraction pattern 211 and the second diffraction pattern 212 will be mainly described with reference to FIGS. 7 to 10B, 12, and 13. The luminance of the reference light emission pattern Pref and the luminances of the plurality of replicated light emission patterns P1 to P8 may be controlled by adjusting the first pitch DP1, the first length d1, and the first thickness t1.

Here, when a relationship between the first pitch DP1 and the first length d1 satisfies Inequation 1 to be described below, and a relationship between the first thickness t1, a refractive index of the first diffraction pattern 211, and a refractive index of the protective layer 220 satisfies Expression 2 to be described below, luminance of at least one light emission pattern of the plurality of replicated light emission patterns P1 to P8 may be about 3% or more of the luminance of the reference light emission pattern Pref.

Meanwhile, in an exemplary embodiment, the first to fourth light emission patterns P1 to P4, which are disposed in the same row or column as the reference light emission pattern Pref, among the plurality of replicated light emission patterns P1 to P8 may have the same luminance. Also, in an exemplary embodiment, the fifth to eighth light emission patterns P5 to P8, which are disposed in a diagonal direction from the reference light emission pattern Pref, among the plurality of replicated light emission patterns P1 to P8 may have the same luminance. However, in an exemplary embodiment, the first to fourth light emission patterns P1 to P4 and the fifth to eighth light emission patterns P5 to P8 may have different luminances. Hereinafter, the reference light emission pattern Pref, the first replicated light emission pattern P1, and the fifth replicated light emission pattern P5 will be mainly described.

First, the relationship between the first pitch DP1 and the first length d1 will be described with reference to Inequation 1. The first pitch DP1 and the first length d1 may satisfy the following Inequation 1.

$$0.4 \leq d1/DP1 \leq 1 \qquad \text{[Inequation 1]}$$

Referring to FIGS. 12 and 13, when the value of d1/DP1 increases, the luminance of the reference light emission pattern Pref substantially decreases while the luminance of the first replicated light emission pattern P1 and the luminance of the fifth replicated light emission pattern P5 substantially increases. Also, referring to the graphs (a), (b) and (c) in FIG. 13 in which the luminances are normalized on the basis of the reference light emission pattern Pref, when the value of d1/DP1 is about 0.4 or greater, the luminance of the first replicated light emission pattern P1 is about 3% or greater of the luminance of the reference light emission pattern Pref. When the value of d1/DP1 ranges from about 0.7 to about 0.9, the luminance of the first replicated light emission pattern P1 may be greater than the luminance of the reference light emission pattern Pref.

Here, when the value of d1/DP1 is 1, the first pitch DP1 and the first length d1 are equal to each other. However, since the cross section of the first diffraction pattern 211 has a circular shape, the cross section of the first diffraction pattern 211 has a region which is not in contact with a cross section of an adjacent diffraction pattern even when the first pitch DP1 and the first length d1 are equal to each other. Therefore, the value of d1/DP1 may become about 1.

Next, the relationship between the first thickness t1, the refractive index of the first diffraction pattern 211, and the refractive index of the protective layer 220 will be described with reference to Inequation 2. The first thickness t1, the refractive index of the first diffraction pattern 211, and the refractive index of the protective layer 220 may satisfy the following Inequation 2.

$$(m \times \lambda_{L1}) - 60 \text{ nm} \leq A \leq (m \times \lambda_{L1}) + 60 \text{ nm, and } A \neq \Delta n \cdot t1 \quad \text{[Inequation 2]}$$

(units of Δn·t1 and A: nm, Δn=|n211−n220|, and m is an integer of 0 or greater)

In Inequation 2, $\lambda_{L1}$ denotes a wavelength of the light L1 emitted from the first OLED 141, n211 denotes the refractive index of the first diffraction pattern 211, and n220 denotes the refractive index of the protective layer 220. In Inequation 2, the unit of A is nm, Δn denotes an absolute value of the difference of the refractive index of the first diffraction pattern 211 and the refractive index of the protective layer 220, and m is an integer of 0 or greater.

Inequation 2 will be described in greater detail with reference to FIGS. 14 and 15.

Figure 14:
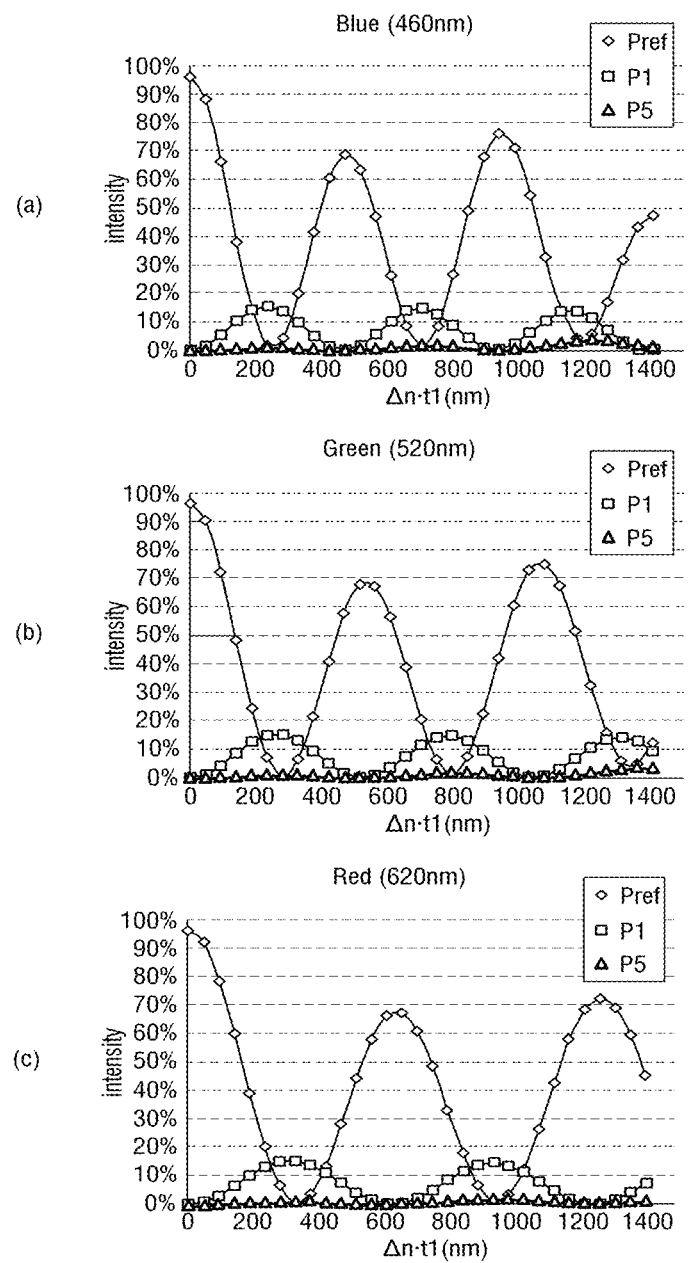
FIG. 14 shows graphs illustrating luminance according to a value of Δn·t1 for each light emission color of an OLED.

FIG. 14 shows graphs illustrating luminance according to a value of Δn·t1 for each light emission color of an OLED. The graph (a) in FIG. 14 is a graph illustrating luminance according to a value of Δn·t1 when an OLED emits blue light. The graph (b) in FIG. 14 is a graph illustrating luminance according to a value of Δn·t1 when an OLED emits green light. The graph (c) in FIG. 14 is a graph illustrating luminance according to a value of Δn·t1 when an OLED emits red light.

Figure 15:
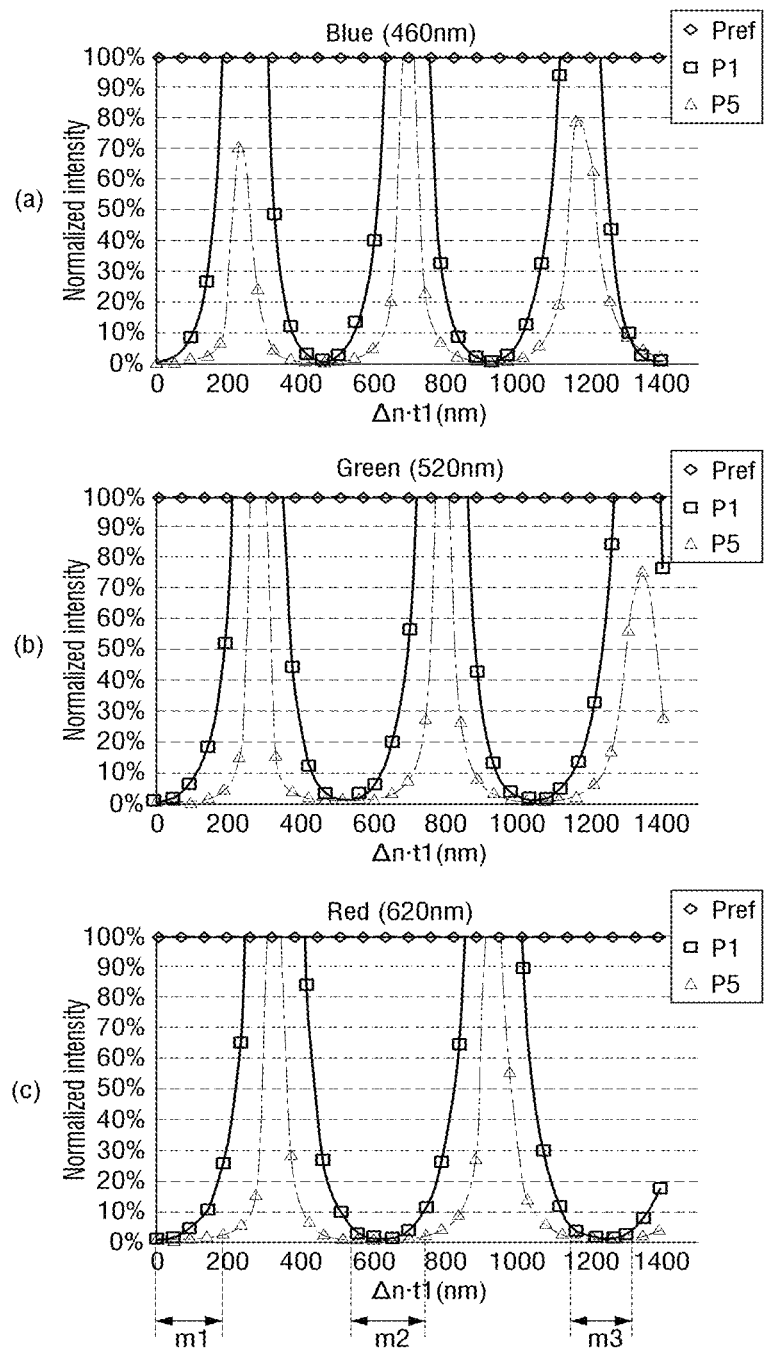
FIG. 15 shows graphs obtained by normalizing luminance of a first replicated light emission pattern and luminance of a fifth replicated light emission pattern on the basis of luminance of a reference light emission pattern (Pref) illustrated in FIG. 14.

FIG. 15 are graphs obtained by normalizing the luminances of the first replicated light emission pattern P1 and the fifth replicated light emission pattern P5 on the basis of the luminance of the reference light emission pattern Pref illustrated in FIG. 14.

Referring to the graphs (a), (b) and (c) in FIG. 14, the reference light emission pattern Pref is repeatedly increased and decreased as the value of Δn·t1 is increased. The luminance of the reference light emission pattern Pref according to the value of Δn·t1 may have a substantially sinusoidal shape on the graph.

Referring to the graphs (a), (b) and (c) in FIG. 15 in which the luminances are normalized on the basis of the reference light emission pattern Pref, the luminances of the first replicated light emission pattern P1 and the fifth replicated light emission pattern P5 are repeatedly increased and decreased as the value of Δn·t1 is increased. That is, the luminances of the first replicated light emission pattern P1 and the fifth replicated light emission pattern P5 according to the value of Δn·t1 may have a substantially sinusoidal shape on the graph.

Hereinafter, the graph (c) in FIG. 15 will be described in greater detail. Sections m1 to m3 illustrated in the graph (c) in FIG. 15 are regions in which both of the luminances of the first replicated light emission pattern P1 and the fifth replicated light emission pattern P5 are less than about 3% of the luminance of the reference light emission pattern Pref. That is, the sections m1 to m3 are included in the range of A of Inequation 2. Therefore, a range of the value of Δn·t1 corresponds to the remaining range except for the range of A of Inequation 2. In the graph (c) of FIG. 15, the section m2 is a section illustrating a range of a value of A when m is 1. Meanwhile, since $\lambda_{L1}$ in the graph (c) of FIG. 15 is 620 nm, the above values may be plugged in Inequation 2 as below.

$$(1 \times 620 \text{ nm}) - 60 \text{ nm} \leq A \leq (1 \times 620 \text{ nm}) + 60 \text{ nm} \Rightarrow 560 \text{ nm} \leq A \leq 680 \text{ nm}$$

Referring to the graph (c) of FIG. 15, both of the luminances of the first replicated light emission pattern P1 and the fifth replicated light emission pattern P5 are less than about 3% of the luminance of the reference light emission pattern Pref in the range of the value of A (560 nm≤A≤680 nm).

Accordingly, when the value of Δn·t1 corresponds to the remaining range except for the range of A of Inequation 2, at least one of the first replicated light emission pattern P1 and the fifth replicated light emission pattern P5 may satisfy about 3% or greater of the luminance of the reference light emission pattern Pref.

As a result, in the plurality of diffraction patterns 210, when the relationship between the first pitch DP1 and the first length d1 satisfies Inequation 1 and the relationship between the first thickness t1, the refractive index n211 of the first diffraction pattern 211, and the refractive index n220 of the protective layer 220 satisfies Inequation 2, the luminance of at least one light emission pattern of the plurality of replicated light emission patterns P1 to P8 may be about 3% or greater of the luminance of the reference light emission pattern Pref.

However, there are no specific limitations on the ranges of the first pitch DP1 and the first length d1 as long as the relationship between the first pitch DP1 and the first length d1 satisfies Inequation 1. In an exemplary embodiment, the first pitch DP1 may be in a range from about 3.5 micrometers (μm) to about 20 μm. In such an embodiment, the first length d1 may be in a range from about 1.4 μm to about 20 μm.

In an exemplary embodiment, there are no specific limitations on values of Δn and t1 as long as the relationship between the first thickness t1, the refractive index n211 of the first diffraction pattern 211, and the refractive index n220 of the protective layer 220 satisfies Inequation 2. In an exemplary embodiment, when the value of Δn is about 0.47, the first thickness t1 may be in a range from about 500 nm to about 650 nm.

Referring back to FIG. 12, when the value of d1/DP1 is in a range from 0.45 to 1, both of the luminances of the first replicated light emission pattern P1 and the fifth replicated light emission pattern P5 may be about 3% or greater of the luminance of the reference light emission pattern Pref. That is, when the value of d1/DP1 is in the range of 0.45 to 1, and when the value of Δn·t1 is different from the range of A of Inequation 2, both of the luminances of the first replicated light emission pattern P1 and the fifth replicated light emission pattern P5 may be about 3% or greater of the luminance of the reference light emission pattern Pref. This means that all of the luminances of the plurality of replicated light emission patterns P1 to P8 may be about 3% or greater of the luminance of the reference light emission pattern Pref.

Hereinafter, a relationship between an effective light emission area ratio and a first diffraction distance β1 will be described.

In an exemplary embodiment, as described above, the light emitted from the plurality of OLEDs 140 is diffracted by the diffraction pattern layer 200. In such an embodiment, as described above, the effective light emission area is increased by the plurality of replicated light emission patterns P1 to P8 replicated and generated from the reference light emission pattern Pref by the diffraction.

However, the first diffraction distance β1, which is defined as the shortest distance between the reference light emission pattern Pref and one of the plurality of replicated light emission patterns P1 to P8, may vary according to the light emission colors of the plurality of OLEDs 140. The first diffraction distance β1 may vary according to distances between the diffraction pattern layer 200 and the plurality of OLEDs 140, refractive indexes of components disposed between the diffraction pattern layer 200 and the plurality of OLEDs 140, and the like in addition to the light emission colors of the plurality of OLEDs 140.

As shown in Table 1 below, the first diffraction distance β1 may affect the above-described effective light emission area ratio. More specifically, as shown in Table 1, the effective light emission area ratio is substantially increased as the first diffraction distance β1 is increased. Accordingly, when factors that affect the first diffraction distance β1 are adjusted, the effective light emission area ratio may be controlled.

TABLE 1

| | Effective Light Emission Area Ratio (%) | | |
|---|---|---|---|
| β1 (μm) | Red (R) | Green (G) | Blue (B) |
| 0.0 | 5.8 | 6.6 | 6.9 |
| 2.4 | 13.4 | 19.1 | 14.8 |
| 4.8 | 19.5 | 32.1 | 27.7 |
| 7.2 | 24.7 | 48.6 | 39.0 |
| 9.6 | 47.8 | 82.6 | 61.1 |
| 12.1 | 74.4 | 93.9 | 83.8 |
| 14.5 | 77.1 | 86.6 | 89.0 |
| 16.9 | 79.5 | 97.9 | 93.8 |
| 19.3 | 89.1 | 85.6 | 96.5 |

The first diffraction distance β1 that affects the effective light emission area ratio will hereinafter be described in greater detail with reference to FIG. 16.

Figure 16:
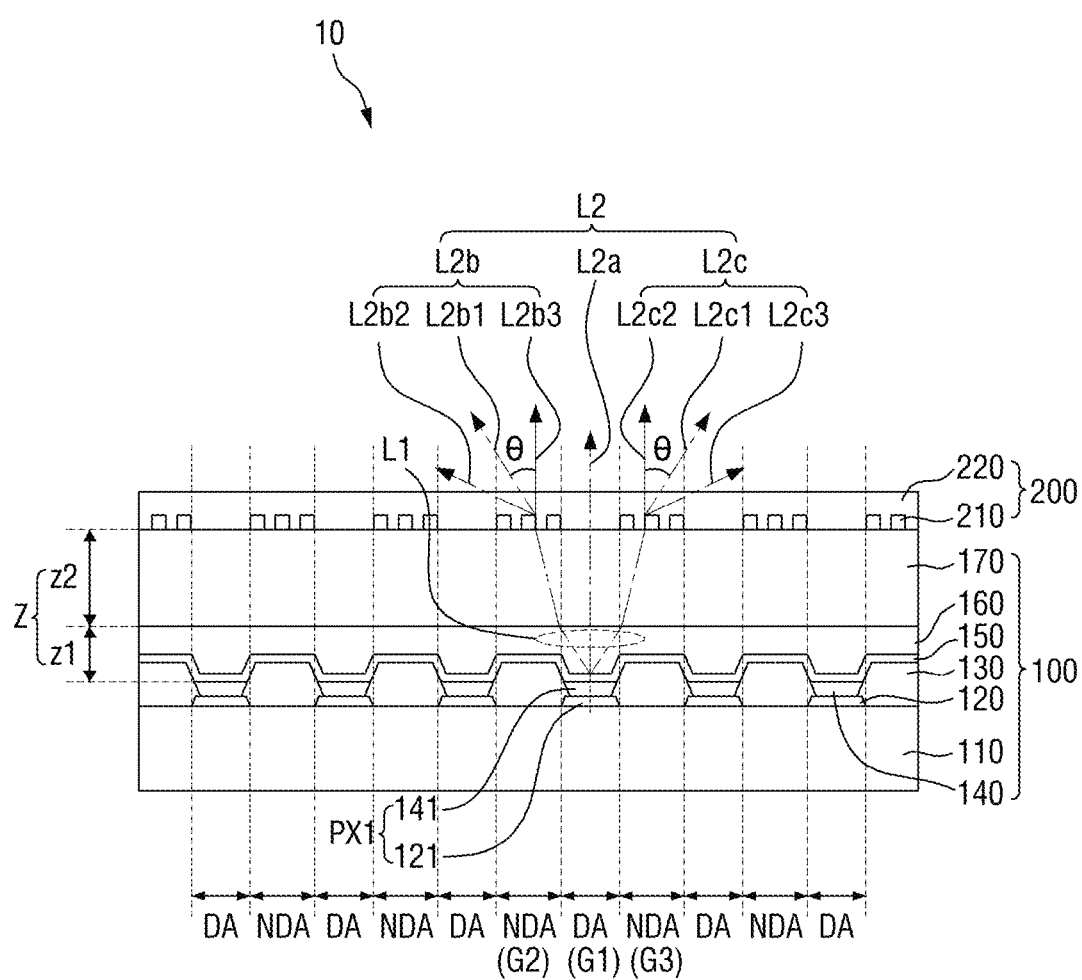
FIG. 16 is a view for describing factors that affect a first diffraction distance.

FIG. 16 is a view for describing factors that affect the first diffraction distance. The same or like elements shown in FIG. 16 have been labeled with the same reference characters as those shown in FIG. 9, and any repetitive detailed description thereof will hereinafter be omitted or simplified. For convenience of description, the first OLED 141 will be mainly described.

Referring to FIG. 16, the first diffraction distance β1 may be determined by the light emission color of the first OLED 141, a distance Z between the diffraction pattern layer 200 and the first OLED 141, the refractive index of the first buffer layer 160, the refractive index of the first encapsulation layer 170, the first pitch DP1 of the plurality of diffraction patterns 210, and the like. Here, the distance Z between the diffraction pattern layer 200 and the first OLED 141 may be expressed as the sum of a distance z1 from an upper surface of the first OLED 141 to a lower surface of the first encapsulation layer 170 and a thickness z2 of the first encapsulation layer 170 as shown in FIG. 16.

The first diffraction distance β1 may be expressed by the following Equation 1. In Equation 1, a refractive index of the common electrode 150 having a relatively small thickness or the like will be ignored.

$$\beta 1 = z1 \cdot \tan\left[\sin^{-1}\left(\frac{\lambda L1}{DP1} \cdot \frac{1}{n160}\right)\right] + z2 \cdot \tan\left[\sin^{-1}\left(\frac{\lambda L1}{DP1} \cdot \frac{1}{n170}\right)\right]$$ [Equation 1]

In Equation 1, n160 denotes the refractive index of the first buffer layer 160, and n170 denotes the refractive index of the first encapsulation layer 170.

Referring to Equation 1, the first diffraction distance β1 may be controlled by adjusting the light emission color of the first OLED 141, the distance Z between the diffraction pattern layer 200 and the first OLED 141, the refractive index of the first buffer layer 160, the refractive index of the first encapsulation layer 170, and the first pitch DP1 of the plurality of diffraction patterns 210. This means that the effective light emission area ratio may be increased by adjusting the first diffraction distance β1.

Next, a relationship between the first diffraction distance β1 and blurring will be described.

As described above with reference to Table 1, the effective light emission area ratio may be substantially increased as the first diffraction distance β1 is increased. However, when the first diffraction distance β1 is increased, blurring may occur. Blurring refers to an image blurring phenomenon that may be caused by display colors of adjacent pixel units overlapping. Therefore, it is desired to calculate an appropriate first diffraction distance β1 to balance between the increase of the effective light emission area ratio and the blurring.

Each of the effective light emission area ratio of and the blurring may be influenced by the distance between pixels. Accordingly, even when two OLED displays in which arrangements of pixels are different from each other have the same diffraction distance, distances between adjacent pixel units may be different because arrangements of pixel units are different. Accordingly, the two OLED displays may have different effective light emission area ratios and degrees of blurring occurrence. That is, the distance between adjacent pixels as well as the first diffraction distance β1 may be considered to balance between the effective light emission area ratio and the blurring.

First, the distance PP1 between pixels will be defined with reference back to FIG. 3.

The distance PP1 between pixels is defined as a distance between pixel units which display a same color as each other. More specifically, the distance PP1 between pixels is defined as a distance between center points of pixel electrodes included in the pixel units which display the same color. Hereinafter, for convenience of description, the first pixel unit PX1 and the second pixel unit PX2 which emit a green light will be described.

The distance PP1 between pixels may refer to the shortest distance between a first center point CP1 located in the first pixel unit PX1 and a second center point CP2 located in the second pixel unit PX2. The first center point CP1 and the second center point CP2 are defined as respective center points of pixel electrodes included in the first pixel unit PX1 and the second pixel unit PX2.

The relationship between the first diffraction distance β1, the distance PP1 between pixels, and the effective light emission area ratio will be described. The following Table 2 illustrates an effective light emission area ratio according to a value of the first diffraction distance β1 divided by the distance PP1 between pixels.

TABLE 2

| | Effective Light Emission Area Ratio (%) | | |
|---|---|---|---|
| β1/PP1 | Red (R) | Green (G) | Blue (B) |
| 0.00 | 5.8 | 6.6 | 6.9 |
| 0.05 | 13.4 | 19.1 | 14.8 |
| 0.10 | 19.5 | 32.1 | 27.7 |
| 0.15 | 24.7 | 48.6 | 39.0 |
| 0.21 | 47.8 | 82.6 | 61.1 |
| 0.26 | 74.4 | 93.9 | 83.8 |
| 0.31 | 77.1 | 86.6 | 89.0 |
| 0.36 | 79.5 | 97.9 | 93.8 |
| 0.41 | 89.1 | 85.6 | 96.5 |

Referring to Table 2, the effective light emission area ratio may be substantially increased as the value of the first diffraction distance β1 divided by the distance PP1 between pixels is increased.

Next, the relationship between the first diffraction distance β1, the distance PP1 between pixels, and blurring will be described with reference to Table 3. The following Table 3 illustrates a blurring recognition score according to the value of the first diffraction distance β1 divided by the distance PP1 between pixels. Here, the blurring recognition score is a result of experimenting with a degree of blurring recognition relative to users while changing the value of the first diffraction distance β1 divided by the distance PP1 between pixels, and illustrates an average value of the degrees of blurring recognition of the users. Here, when a visual blurring recognition score is 5 or greater, blurring is recognized to the extent that a user can feel discomfort when viewing a screen.

TABLE 3

| β1/PP1 | Blurring Recognition Score (Perfect score: 10 points) |
| --- | --- |
| 0.2 | 1.3 |
| 0.45 | 1.2 |
| 0.89 | 2.4 |
| 1.33 | 4.0 |
| 1.89 | 5.1 |
| 2.26 | 6.4 |

Referring to Table 3, when the value of the first diffraction distance β1 divided by the distance PP1 between pixels is about 1.89 or greater, the blurring recognition score of the users is 5 or greater. This means that when the value of the first diffraction distance β1 divided by the distance PP1 between pixels is greater than about 1.9, most users recognize blurring and feel discomfort.

Therefore, in consideration of the above Tables 2 and 3, the value of the first diffraction distance β1 divided by the distance PP1 between pixels may satisfy the following Inequation 3.

$$0.1 \leq \beta1/PP1 \leq 1.9 \quad \text{[Inequation 3]}$$

Referring to Inequation 3, the value of the first diffraction distance β1 divided by the distance PP1 between pixels may be set to 0.1 or greater and 1.9 or less to balance between the effective light emission area ratio and the degree of visual blurring recognition. Accordingly, in an exemplary embodiment of the display device, luminous efficiency may be improved by increasing the effective light emission area ratio without causing discomfort due to the visual blurring recognition.

In an exemplary embodiment, as long as the value of the first diffraction distance β1 divided by the distance PP1 between pixels satisfies 0.1 or greater and 1.9 or less, there are no specific limitations on a value of each of the first diffraction distance β1 and the distance PP1 between pixels. In an exemplary embodiment, the thickness z2 of the first encapsulation layer 170 and the first pitch DP1 may have values described in the following Table 4.

TABLE 4

| Case | z2 (mm) | DP1 (µm) |
| --- | --- | --- |
| 1 | 0.2 | 0.88-15.3 |
| 2 | 0.3 | 1.24-22.7 |
| 3 | 0.5 | 2-37.4 |

Next, an alternative exemplary embodiment of the disclosure will be described.

Figure 17:
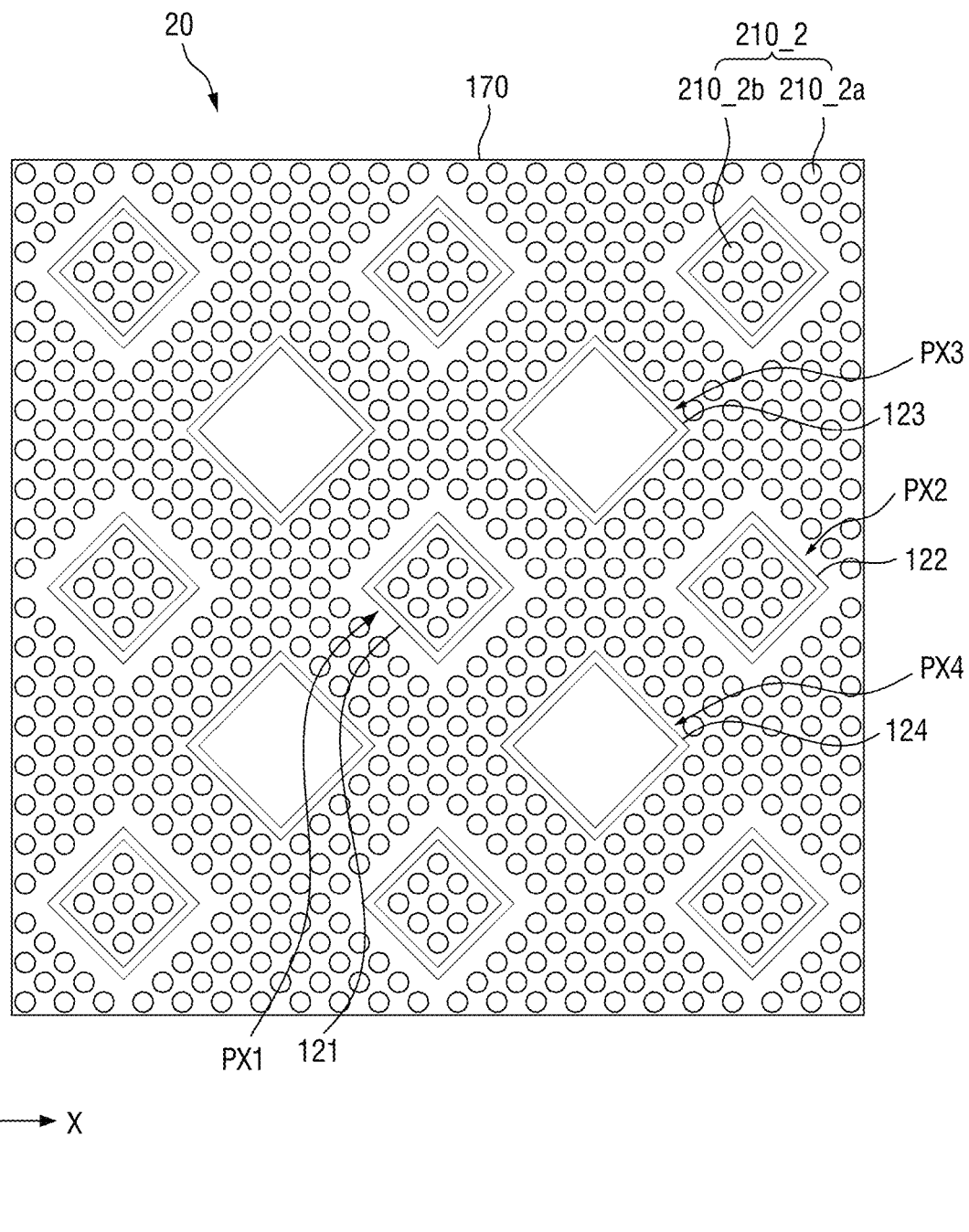
FIG. 17 is a view illustrating a plurality of diffraction patterns and an arrangement structure of a plurality of pixel units in a display device according to an alternative exemplary embodiment of the disclosure.

FIG. 17 is a view illustrating a plurality of diffraction patterns and an arrangement structure of a plurality of pixel units in a display device according to another exemplary embodiment of the disclosure. Descriptions identical to those given with reference to FIGS. 1 to 16 will be omitted.

Referring to FIG. 17, a plurality of diffraction patterns 210_2 may include a plurality of first sub diffraction patterns 210_2a and a plurality of second sub diffraction patterns 210_2b. Here, the plurality of first sub diffraction patterns 210_2a are defined as diffraction patterns disposed only in the above-described non-display region NDA, and the plurality of second sub diffraction patterns 210_2b are defined as diffraction patterns disposed in at least a portion of the display region DA.

In an exemplary embodiment, as shown in FIG. 17, the diffraction patterns 210_2 further includes second sub diffraction patterns 210_2b disposed on at least a portion of the display region DA.

In an exemplary embodiment, the plurality of second sub diffraction patterns 210_2b may overlap a first pixel unit PX1 and a second pixel unit PX2 which emit a green light. However, the disclosure is not limited thereto. Alternatively, the plurality of second sub diffraction patterns 210_2b may overlap a third pixel unit PX3 which emits a red light or a fourth pixel unit PX4 which emits a blue light. In another alternative exemplary embodiment, the plurality of second sub diffraction patterns 210_2b may overlap pixel units which emit two different colors as well as a plurality of pixel units which emit one color.

FIGS. 18 to 21 are views showing another alternative exemplary embodiment of the diffraction pattern layer. In FIGS. 18 to 21, for convenience of description, the exemplary embodiments of the diffraction pattern layer will be described on the basis of the region A illustrated in FIGS. 3 and 4.

Figure 18:
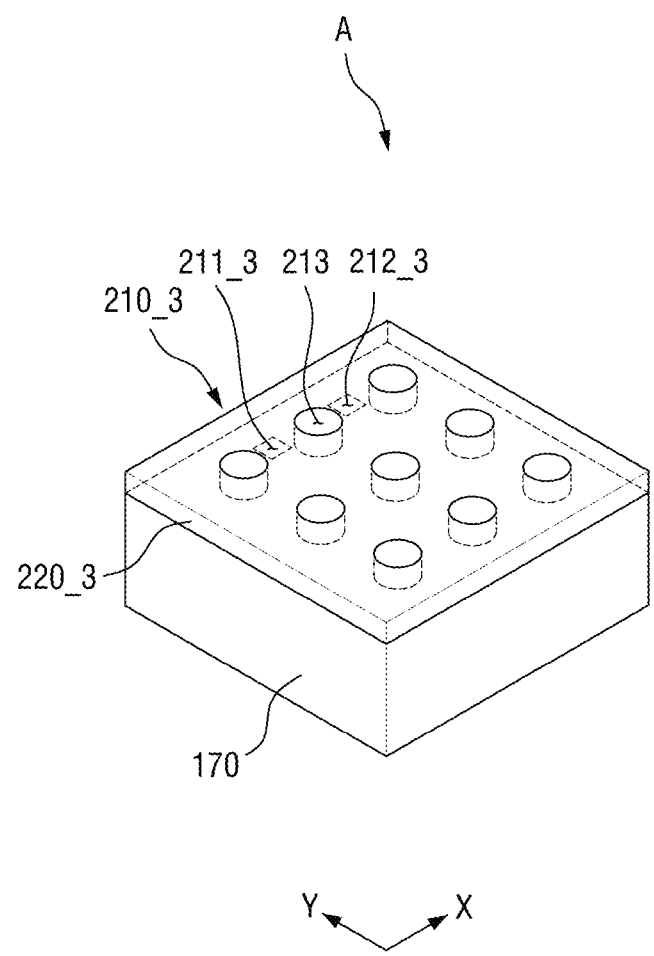
FIGS. 18 to 21 are views showing another alternative exemplary embodiment of a diffraction pattern layer.
Figure 19:
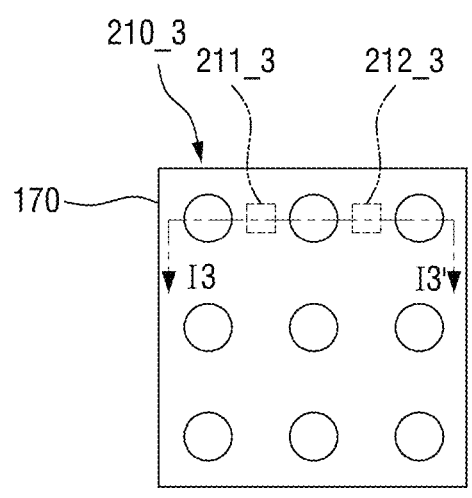
Figure 20:
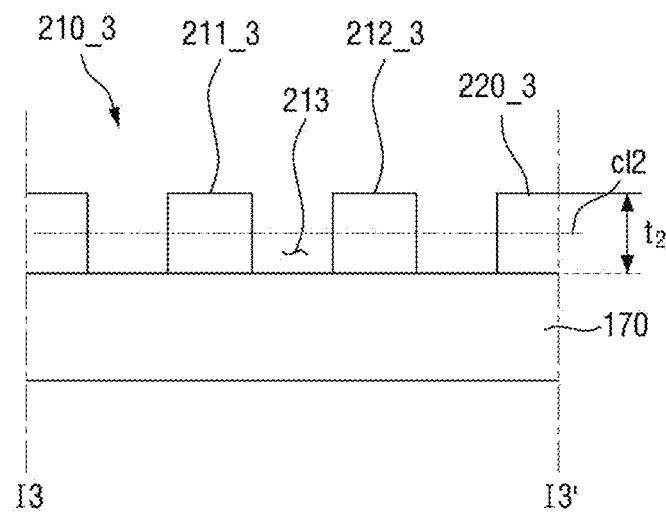

Referring to FIGS. 18 to 21, in an exemplary embodiment, a diffraction pattern layer may include a plurality of diffraction patterns 210_3 defined by a protective layer 220_3. In such an embodiment, as shown in FIGS. 18 and 20, a plurality of holes 213 is defined in the protective layer 220_3. Accordingly, the plurality of diffraction patterns 210_3 are defined as patterns protruding from the first encapsulation layer 170.

In such an embodiment, as shown in FIG. 20, the plurality of diffraction patterns 210_3 may have a second thickness t2. The second thickness t2 refers to a distance from a lower surface (i.e., an upper surface of the first encapsulation layer 170) of each of the plurality of diffraction patterns 210_3 to an upper surface (i.e., an upper surface of each of the plurality of diffraction patterns 210_3) thereof with reference to FIG. 20.

The plurality of diffraction patterns 210_3 may have a second pitch DP2 and a second length d2. As described above, the second pitch DP2 and the second length d2 are defined on the basis of a cross-sectional region cs2 of the plurality of diffraction patterns 210_3 taken along a second imaginary line cl2. That is, the second imaginary line cl2 refers to a line passing through half of the second thickness t2 of each of the plurality of diffraction patterns 210_3. Reference numeral 211_3a denotes a cross section of a first diffraction pattern 211_3 taken along the second imaginary line cl2. Reference numeral 212_3a denotes a cross section of a second diffraction pattern 212_3 taken along the second imaginary line cl2. In such an embodiment, each diffraction pattern may be defined as a portion of the protective layer 220_3 between two adjacent holes 213.

In another alternative exemplary embodiment, the diffraction pattern layer 200_3 may defined by a portion of the first encapsulation layer 170. In such an embodiment, the diffraction pattern layer 200_3 may be formed by etching the first encapsulation layer 170.

Figure 21:
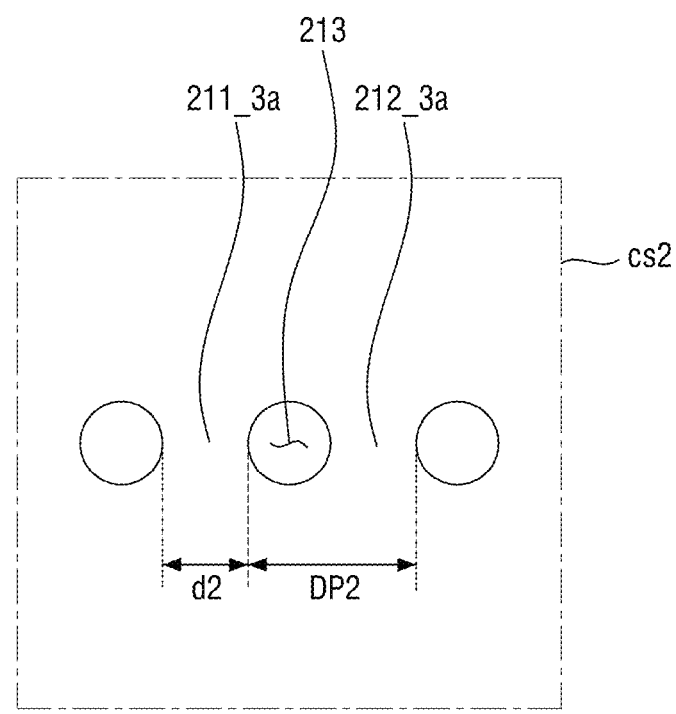

Referring to FIG. 21, the second pitch DP2 is defined as a distance from one side of the cross section 211_3a of the first diffraction pattern 211_3 to one side of the cross section 212_3a of the second diffraction pattern 212_3. Also, the second length d2 refers to a width of the cross section 211_3a of the first diffraction pattern 211_3.

In an alternative exemplary embodiment, although not illustrated in the drawings, the diffraction pattern layer may include a plurality of diffraction patterns having a rectangular cross-sectional shape. When the shape of each of the plurality of diffraction patterns is square in cross section, in an exemplary embodiment, the plurality of diffraction patterns may have a cubic shape. Alternatively, the plurality of diffraction patterns may be defined by a protective layer in which a plurality of holes having rectangular shape is defined.

When the cross-sectional shape of each of the plurality of diffraction patterns is a square, the above-mentioned Inequation 1 may be converted to the following inequation: $4 \leq d1/DP1 < 1$.

That is, since the cross-sectional shape of each of the plurality of diffraction patterns is rectangular, a minimum space for diffraction is not included when the first pitch DP1 and the first length d1 are equal to each other. Accordingly, the case in which the value of d1/DP1 is 1 is excluded.

In still another alternative exemplary embodiment, areas of upper surfaces and lower surfaces of the plurality of diffraction patterns may be different from each other. In one exemplary embodiment, for example, the plurality of diffraction patterns may have a shape protruding in a hemispherical shape in a light emitting direction or a shape protruding in a trapezoidal shape. In exemplary embodiments, regardless of the shapes of the plurality of diffraction patterns, the first pitch DP1 and the first length d1 are defined on the basis of a cross section taken along an imaginary line passing through half of the plurality of diffraction patterns as described above.

Figure 22:
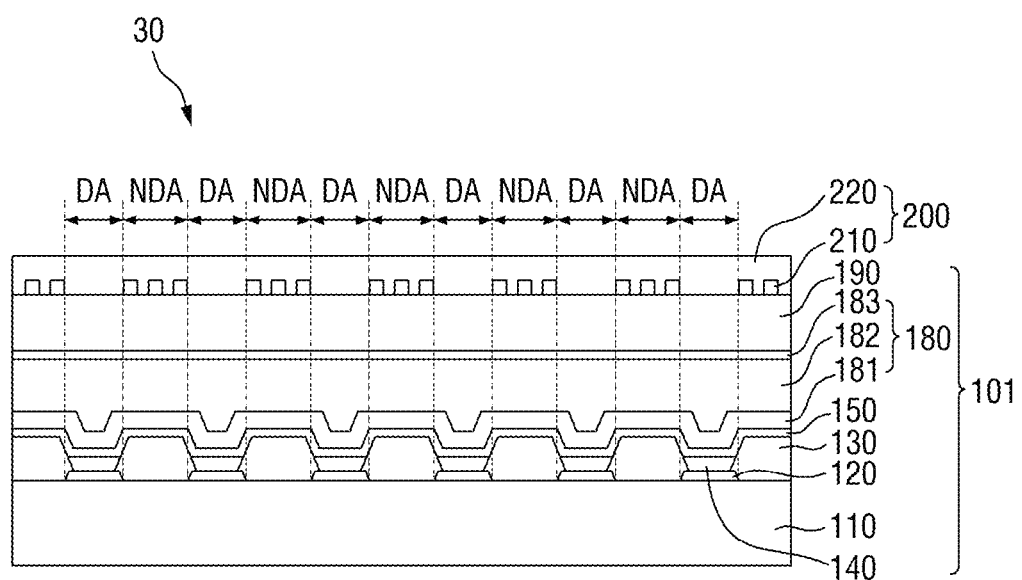
FIG. 22 is a cross-sectional view schematically illustrating a display device according to still another alternative exemplary embodiment of the disclosure.

FIG. 22 is a cross-sectional view schematically illustrating a display device according to still another exemplary embodiment of the disclosure. The same or like elements shown in FIG. 22 have been labeled with the same reference characters as those in the exemplary embodiments described above with reference to FIGS. 1 to 21, and any repetitive detailed description thereof will hereinafter be omitted or simplified.

In an exemplary embodiment, as shown in FIG. 22, a display device 30 ac may include a display panel 101 and a diffraction pattern layer 200. The display device 30 illustrated in FIG. 22 is substantially the same as the display device 10 illustrated in FIG. 1 except that the first encapsulation layer 170 is replaced by a second encapsulation layer 180.

The display panel 101 may include the second encapsulation layer 180 and a second buffer layer 190.

In an exemplary embodiment, the second encapsulation layer 180 may have a structure in which an organic layer and an inorganic layer are stacked one on another. In such an embodiment, as shown in FIG. 22, the second encapsulation layer 180 may include a first inorganic layer 181, an organic layer 182, and a second inorganic layer 183.

The first inorganic layer 181 may be disposed on a common electrode 150. The first inorganic layer 181 may include at least one of silicon oxide (SiOx), silicon nitride (SiNx), and silicon oxynitride (SiONx).

The organic layer 182 may be disposed on the first inorganic layer 181. The organic layer 182 may include at least one of epoxy, acrylate, and urethane acrylate. The organic layer 182 may planarize a step caused by a pixel definition film 130.

The second inorganic layer 183 may be disposed on the organic layer 182. The second inorganic layer 183 may include at least one of silicon oxide ($SiO_x$), silicon nitride ($SiN_x$), and silicon oxynitride ($SiON_x$).

In an exemplary embodiment, as shown in FIG. 22, each of the first inorganic layer 181, the organic layer 182 and the second inorganic layer 183 may have a single layer structure, but the disclosure is not limited thereto. Alternatively, at least one layer of the first inorganic layer 181, the organic layer 182 and the second inorganic layer 183 may have a stacked multilayer structure.

In another exemplary embodiment, the second encapsulation layer 180 may be a hexamethyldisiloxane ("HMDSO") layer. In such an embodiment, the second encapsulation layer 180 may include the first inorganic layer 181, the second inorganic layer 183, and an HMDSO layer disposed between the first inorganic layer 181 and the second inorganic layer 183. In such an embodiment, the above-described organic layer 182 may be replaced by an HMDSO layer.

In such an embodiment, the HMDSO layer may be formed through a same chamber after forming the first inorganic layer 181. Accordingly, a process of forming the second encapsulation layer 180 may be simplified. In such an embodiment, the second encapsulation layer 180 is an HMDSO layer capable of absorbing stress, and thus the second encapsulation layer 180 may have sufficient flexibility.

The second buffer layer 190 may be disposed on the second inorganic layer 183. In such an embodiment, a material of the second buffer layer 190 is not particularly limited. In such an embodiment, the second buffer layer 190 may include an inorganic material or an organic material. Alternatively, the second buffer layer 190 may have a structure in which one or more layers of an organic layer and an inorganic layer are arranged in a single layer or are stacked one on another in a multilayer. The second buffer layer 190 has a predetermined thickness, and thus the plurality of OLEDs 140 and the diffraction pattern layer 200 may be spaced a predetermined distance from each other.

In such an embodiment, separation distances between the plurality of OLEDs 140 and the plurality of diffraction patterns 210 may be controlled by controlling a thickness of the second buffer layer 190 to control the diffraction distance. In an exemplary embodiment, the thickness of the second buffer layer 190 may be about 200 μm or less.

In an alternative exemplary embodiment, the second buffer layer 190 may be omitted. In such an embodiment, where the second buffer layer 190, the separation distances between the plurality of OLEDs 140 and the diffraction pattern layer 200 may not be sufficiently secured. When the separation distances between the plurality of OLEDs 140 and the diffraction pattern layer 200 are not sufficiently secured, a predetermined diffraction distance may not be formed and an effect of an increase of the effective light emission area ratio may be lowered. Therefore, in such an embodiment where the second buffer layer 190 is omitted, the separation distances between the plurality of OLEDs 140 and the diffraction pattern layer 200 may be sufficiently secured by changing an arrangement order of the diffraction pattern layer 200 and other components (e.g., an anti-reflection panel or an input sensing panel). This will be described later in greater detail with reference to FIGS. 24 to 26.

Hereinafter, an exemplary embodiment, where the diffraction pattern layer 200 is replaced by a diffraction panel 201, will be described first with reference to FIG. 23.

Figure 23:
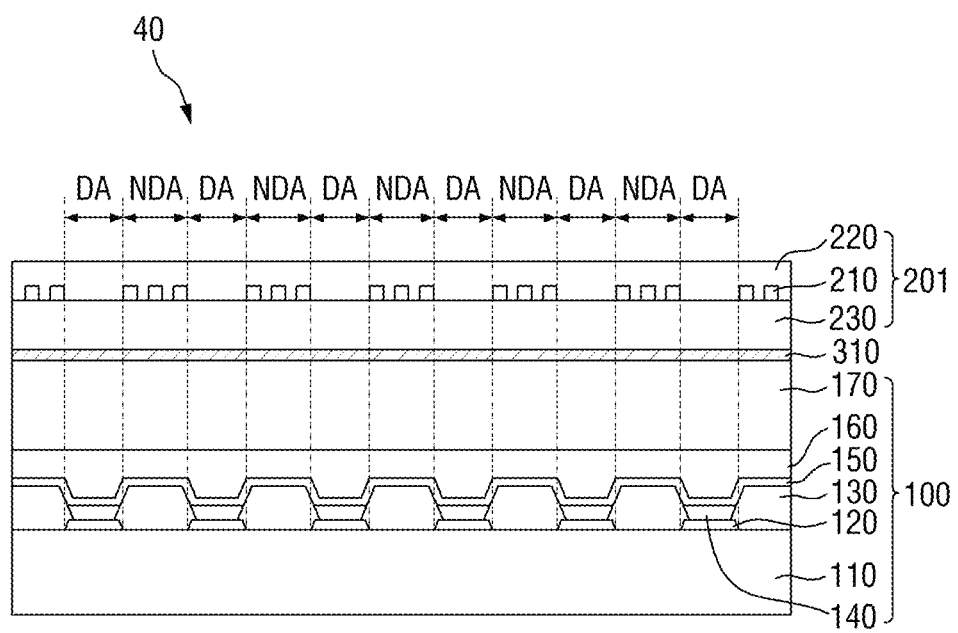
FIG. 23 is a cross-sectional view schematically illustrating a display device according to yet another alternative exemplary embodiment of the disclosure.

FIG. 23 is a cross-sectional view schematically illustrating a display device according to yet another alternative exemplary embodiment of the disclosure.

A display device 40 illustrated in FIG. 23 is substantially the same as the display device 10 illustrated in FIG. 1 except that the diffraction pattern layer 200 is replaced by the diffraction panel 201. In such an embodiment, the diffraction panel 201 may include a base layer 230 which provides a base surface for the plurality of diffraction patterns 210. The diffraction panel 201 may be coupled to the display panel 100 through a first adhesive member 310. In an exemplary embodiment, the first adhesive member 310 may include a PSA. However, the disclosure is not limited thereto, and in an alternative exemplary embodiment, the first adhesive member 310 may include an OCA. Alternatively, the first adhesive member 310 may be an OCR film.

In such an embodiment, the diffraction panel 201 and the display panel 100 may be formed independently of each other through separate processes, and may then be coupled to each other through the first adhesive member 310. Although not illustrated in the drawing, the display panel 100 may be replaced by the display panel 101 including the second encapsulation layer 180 illustrated in FIG. 22.

Next, the arrangement order of the diffraction pattern layer 200 or the diffraction panel 201 and other components in another alternative exemplary embodiment will be described with reference to FIGS. 24 to 26.

Figure 24:
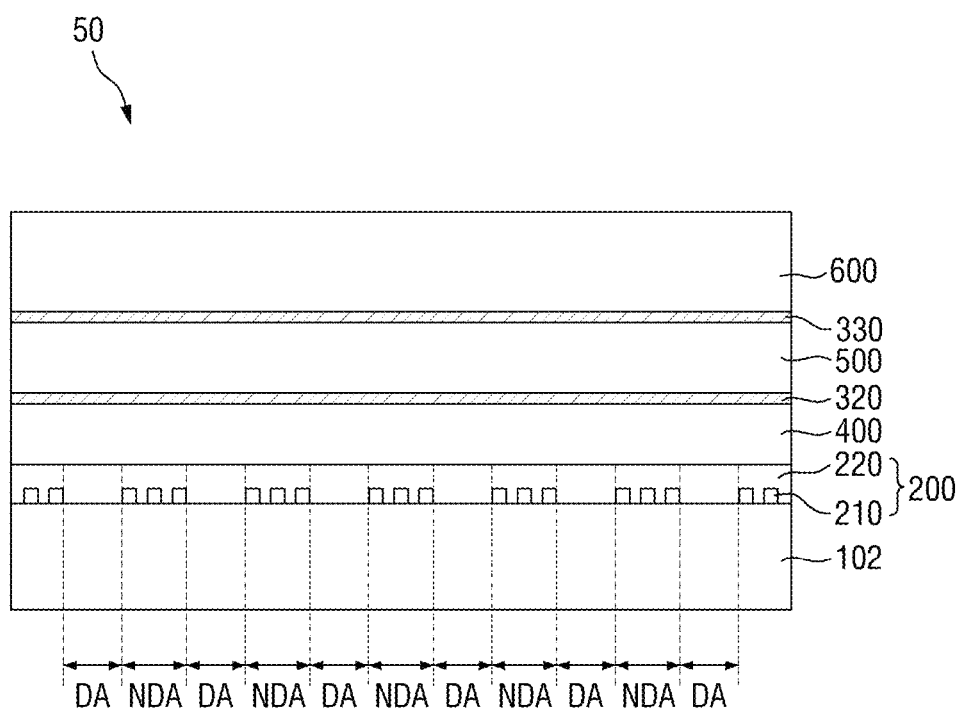
FIGS. 24 to 26 are cross-sectional views schematically illustrating display devices according to other alternative exemplary embodiments of the disclosure.
Figure 25:
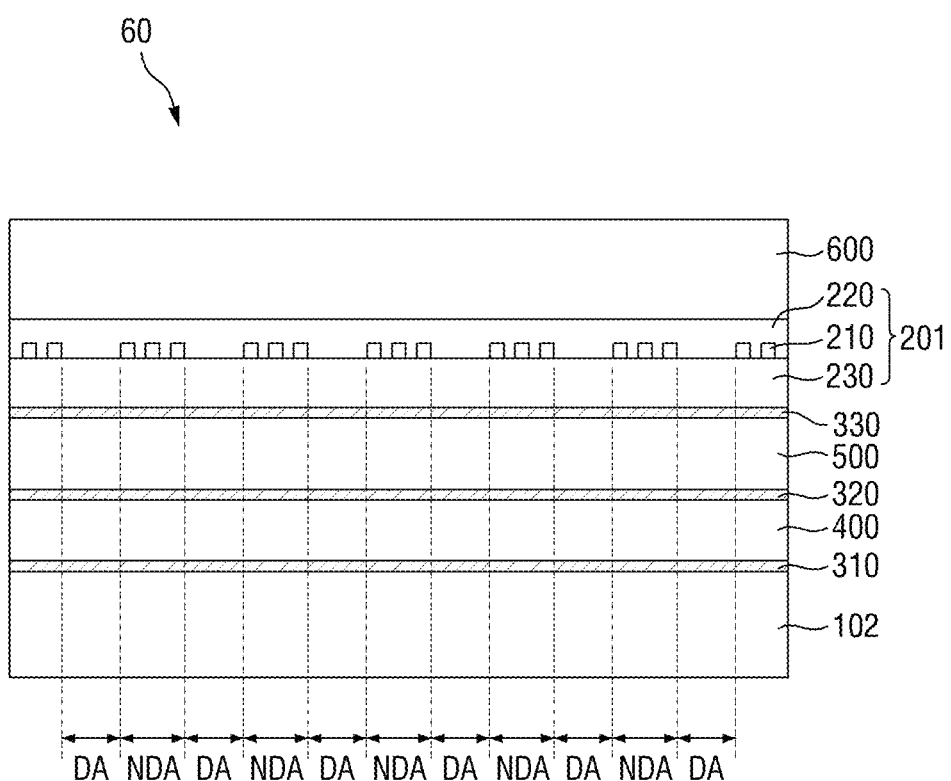
Figure 26:
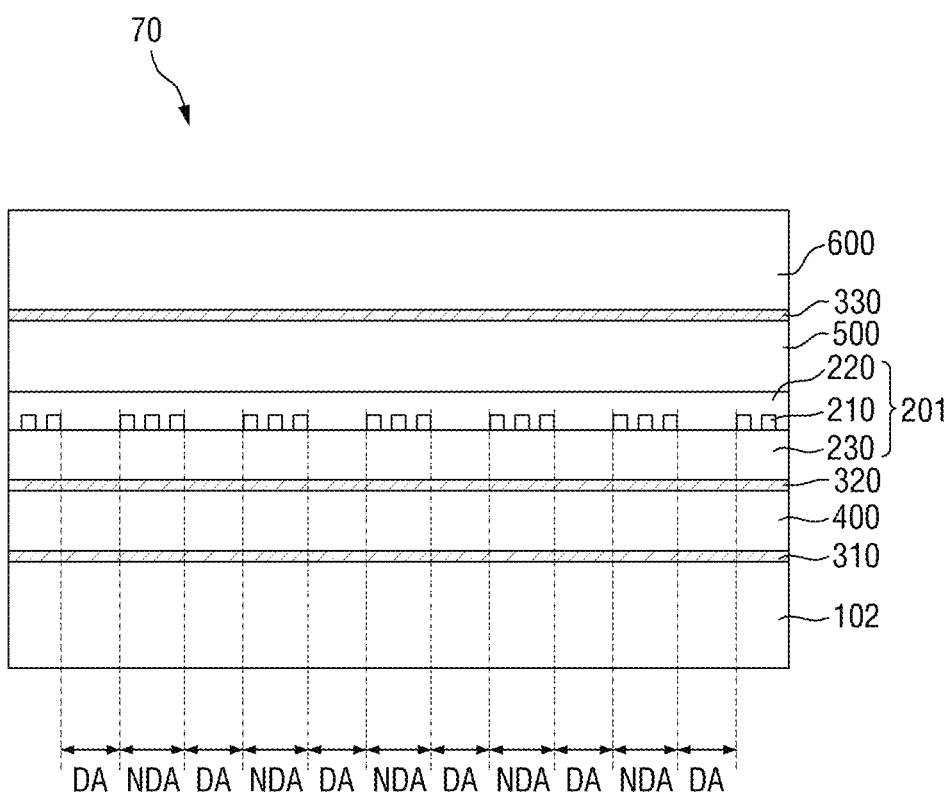

FIGS. 24 to 26 are cross-sectional views schematically illustrating display devices according to other alternative exemplary embodiments of the disclosure.

Referring to FIG. 24, an exemplary embodiment of a display device 50 may include a display panel 102, a diffraction pattern layer 200, an input sensing panel 400, an anti-reflection panel 500, and a window panel 600. In such an embodiment, the display panel 102 may be the display panel 100 including the first encapsulation layer 170 or the display panel 101 including the second encapsulation layer 180.

The input sensing panel 400 may be disposed on the diffraction pattern layer 200. In an exemplary embodiment, as described above, the protective layer 220 may include an adhesive material. Accordingly, the diffraction pattern layer 200 and the input sensing panel 400 may be coupled to each other without a separate adhesive member. The input sensing panel 400 may obtain coordinate information through an external input, for example, a touch or the like. In such an embodiment, the input sensing panel 400 may be a touch panel which senses a touch of a user or a fingerprint sensing panel which obtains fingerprint information of the user.

In an exemplary embodiment, the input sensing panel 400 may sense an external input in a capacitive manner. However, the input sensing method is not particularly limited. In an alternative exemplary embodiment, the input sensing panel 400 may sense an external input through an electromagnetic induction method or a pressure sensing method. In an exemplary embodiment, the input sensing panel 400 may be an input sensing layer which is formed on the diffraction pattern layer 200 through a continuous process.

The anti-reflection panel 500 may be disposed on the input sensing panel 400. In an exemplary embodiment, the anti-reflection panel 500 may be coupled to the input sensing panel 400 through a second adhesive member 320. In an exemplary embodiment, the second adhesive member 320 may include a PSA. However, the disclosure is not limited thereto, and in another alternative exemplary embodiment, the second adhesive member 320 may include an OCA. Alternatively, the second adhesive member 320 may include an OCR film.

The anti-reflection panel 500 may reduce reflectance of external light incident thereon from an upper side of the window panel 600 to be described below. In an exemplary embodiment, the anti-reflection panel 500 may include a phase retarder and a polarizer.

In an exemplary embodiment, the phase retarder may be a film type or liquid crystal coating type phase retarder. Alternatively, the phase retarder may include a λ/2 phase retarder and/or a λ/4 phase retarder. In an exemplary embodiment, the polarizer may be a film type or a liquid crystal coating type. In such an embodiment, the film type may include a stretch-type synthetic resin film, and the liquid crystal coating type may include liquid crystals oriented in a predetermined array. In an exemplary embodiment, the phase retarder and the polarizer may further include a protective film. In such an embodiment, each of the phase retarder and the polarizer may be defined as a base layer of the anti-reflection panel 500. When each of the phase retarder and the polarizer further includes a protective film, the protective film may be defined as the base layer of the anti-reflection panel 500.

The window panel 600 may be disposed on the anti-reflection panel 500. In an exemplary embodiment, the window panel 600 may be coupled to the anti-reflection panel 500 through a third adhesive member 330. Here, in an exemplary embodiment, the third adhesive member 330 may include an OCA. Alternatively, the third adhesive member 330 may include an OCR film or a PSA.

In an alternative exemplary embodiment, locations of the input sensing panel 400 and the anti-reflection panel 500 may be changed.

In such an embodiment, reflectance due to external light may be reduced by disposing the anti-reflection panel 500 on the diffraction pattern layer 200. However, as an optical distance between the diffraction pattern layer 200 and the display panel 102 is reduced, a predetermined diffraction distance may not be secured and an effective light emission area ratio may be reduced. In an exemplary embodiment, where the display panel 102 is the display panel 100 illustrated in FIG. 1, the display panel 102 includes the first encapsulation layer 170 having a relatively large thickness, and thus the optical distance may be secured. In an alternative exemplary embodiment, where the display panel 102 is the display panel 101 illustrated in FIG. 22, the optical distance may be secured by increasing the thickness of the second buffer layer 190.

Referring to FIG. 25, in an alternative exemplary embodiment, the input sensing panel 400 may be disposed on the display panel 102. The input sensing panel 400 may be coupled to the display panel 102 through the first adhesive member 310. The anti-reflection panel 500 may be disposed on the input sensing panel 400. The anti-reflection panel 500 may be coupled to the input sensing panel 400 through the second adhesive member 320.

The diffraction panel 201 may be disposed on the anti-reflection panel 500. The diffraction panel 201 may be coupled to the anti-reflection panel 500 through the third adhesive member 330. The input sensing panel 400 and the anti-reflection panel 500 may be disposed between the diffraction panel 201 and the display panel 102, and thus a separation distance (or an optical distance) between the display panel 102 and the diffraction panel 201 may be sufficiently secured.

Referring to FIG. 26, in another alternative exemplary embodiment, the diffraction panel 201 may be disposed between the anti-reflection panel 500 and the input sensing panel 400.

Figure 27A:
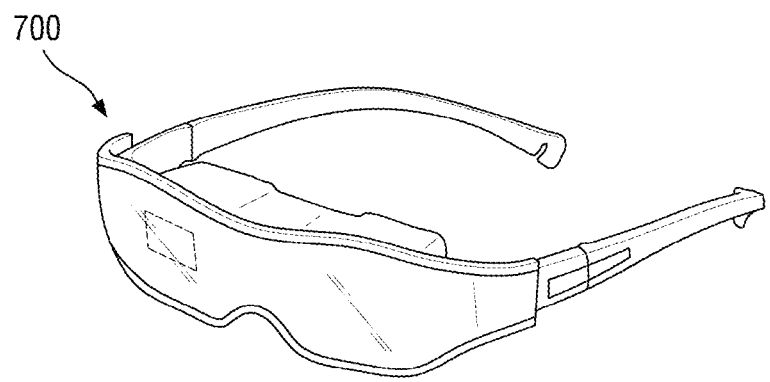
FIG. 27A is a view illustrating an exemplary embodiment of a head mount display device including the display device illustrated in FIG. 1.
Figure 27B:
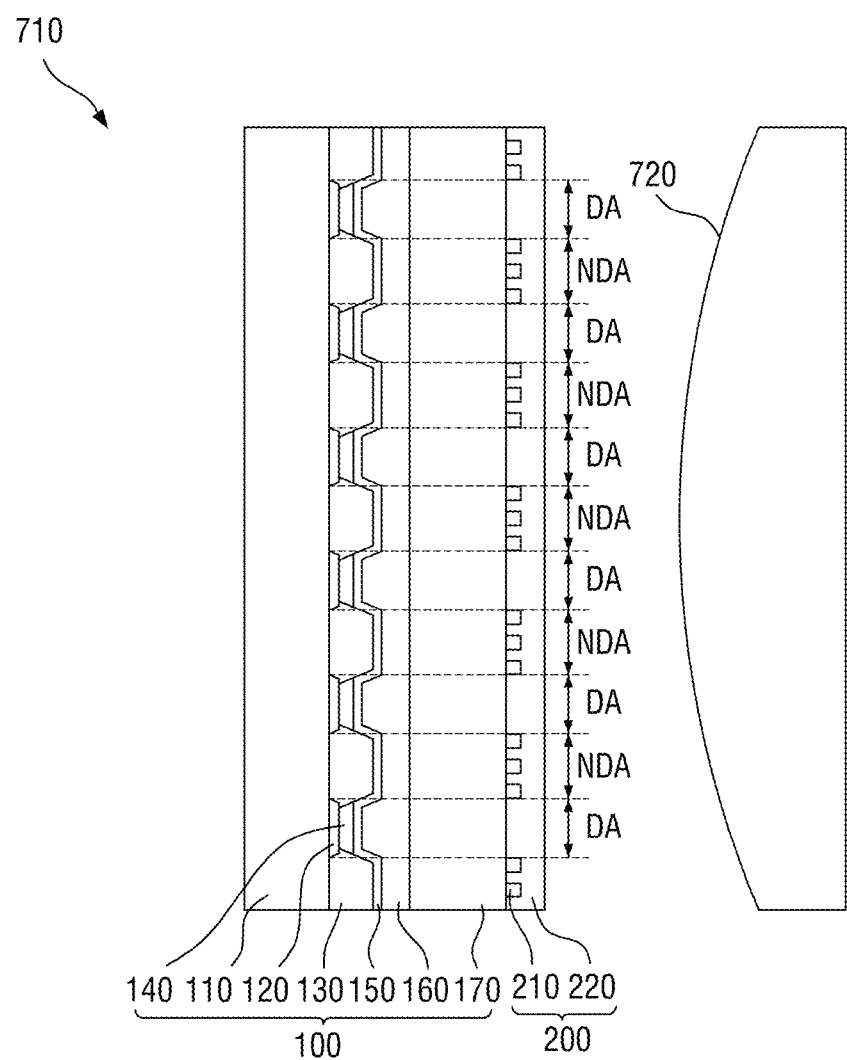
FIG. 27B is a partial enlarged cross-sectional view corresponding to the encircled portion in FIG. 27A.
Figure 28:
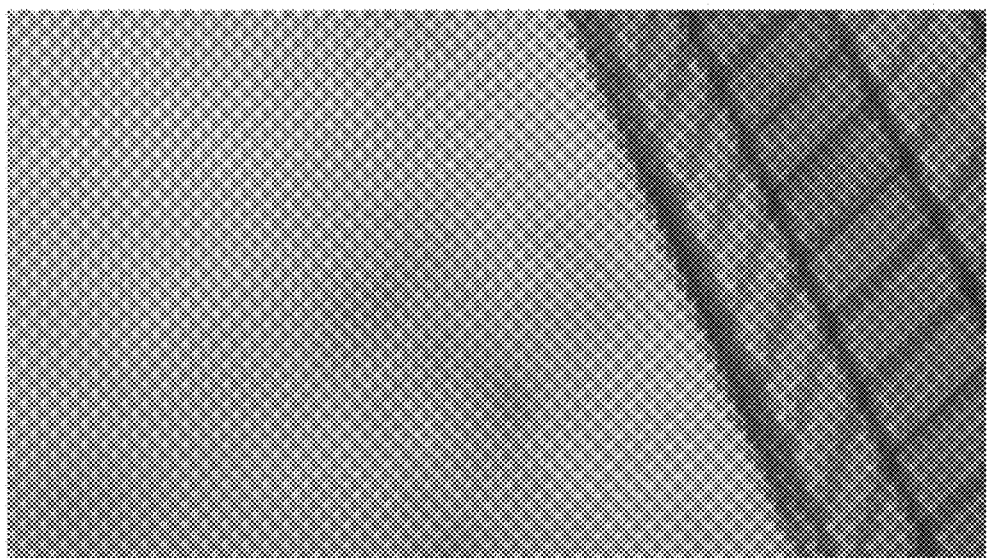
FIG. 28 is a view illustrating a screen door effect ("SDE") in a conventional head mount display device.
Figure 29:
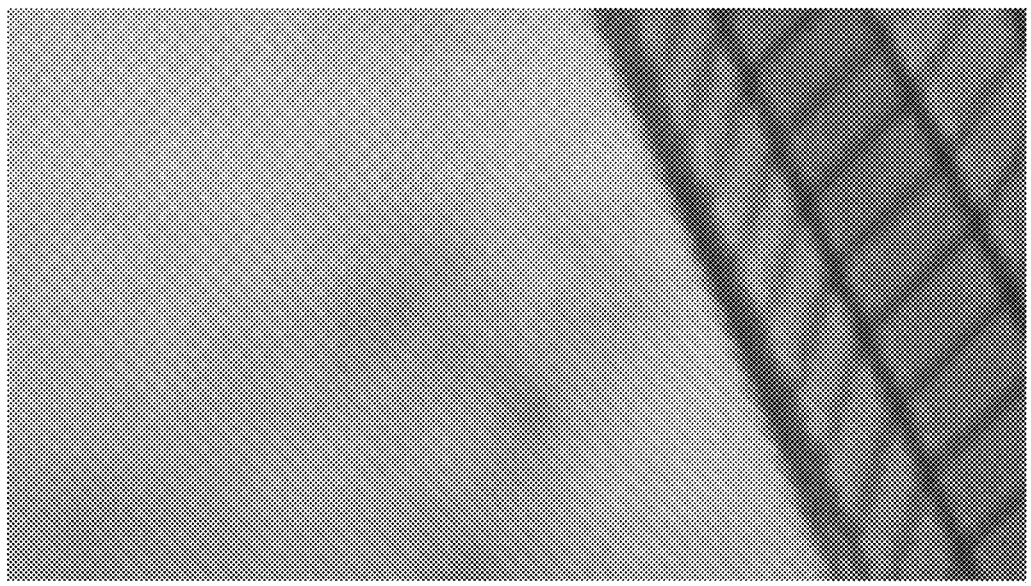
FIG. 29 is a view illustrating reduced SDE in the head mount display device according to an exemplary embodiment of the disclosure.

FIG. 27A is a view illustrating an exemplary embodiment of a head mount display device including the display device illustrated in FIG. 1, and FIG. 27B is a partial enlarged cross-sectional view corresponding to the encircled portion in FIG. 27A. FIG. 28 is a view illustrating a screen door phenomenon in a conventional head mount display device. FIG. 29 is a view illustrating an reduced screen door phenomenon in the head mount display device according to an exemplary embodiment of the disclosure.

Referring to FIGS. 1 and 27, an exemplary embodiment of a head mount display device 700 may include a display unit 710 and a lens unit 720. Although not illustrated in the drawings, the head mount display device may further include a camera, an infrared sensor, a signal processing unit, and a frame to be mounted on a head of a user.

The lens unit 720 may receive light from the display unit 710. In an exemplary embodiment, the lens unit 720 may be disposed between an object to be seen and the user. In an exemplary embodiment, the lens unit 720 may be formed with an opaque lens to realize virtual reality. In an alternative exemplary embodiment, the lens unit 720 may be a transparent lens or a translucent lens to realize augmented reality. In an exemplary embodiment, as shown in FIG. 27B, the lens unit 720 may be a convex lens.

The display unit 710 may correspond to the display device 10 illustrated in FIG. 1. In such an embodiment, the display unit 710 may include the display panel 100 and the diffraction pattern layer 200. An effective light emission area may be enlarged due to a phenomenon of interference of light generated by light emitted from the plurality of OLEDs 140 included in the display panel 100 passing through the diffraction pattern layer 200.

In such an embodiment, an image of the display unit 710 may be enlarged by the lens unit 720 so that the user may view an enlarged image the object. However, a screen door effect ("SDE") may occur due to an enlargement environment. In such an embodiment, a boundary with the pixel definition film 130 (see FIG. 1) may be visually recognized by the user due to the enlargement environment. However, in such an embodiment, a region visually recognizable by the user due to the enlargement environment corresponds to a non-emission region.

As described above, the effective light emission area ratio refers to a ratio of a light emission region in one region. An increase of the effective light emission area ratio refers to an increase of an area of the light emission region or a decrease of an area of the non-emission region.

Accordingly, in an exemplary embodiment of the head mount display device, the area of the non-emission region may be reduced, and the area of the non-emission region visually recognized by the user due to the enlargement environment may be reduced. Accordingly, the SDE may be reduced.

In a conventional head mount display device, as shown in FIG. 28, an interval between the pixel definition films 130 and the like may be visually recognized as a web. That is, the SDE is visually recognized. In an exemplary embodiment, as shown in FIG. 29, a degree of visual recognition of the interval with the pixel definition film 130 is improved in comparison to that in FIG. 28. This means that the SDE is reduced. Herein, although the display unit 710 is described as including the display panel 100 illustrated in FIG. 1, the disclosure is not limited thereto. Alternatively, the display unit 710 may include the display panel 101 illustrated in FIG. 22.

Figure 30:
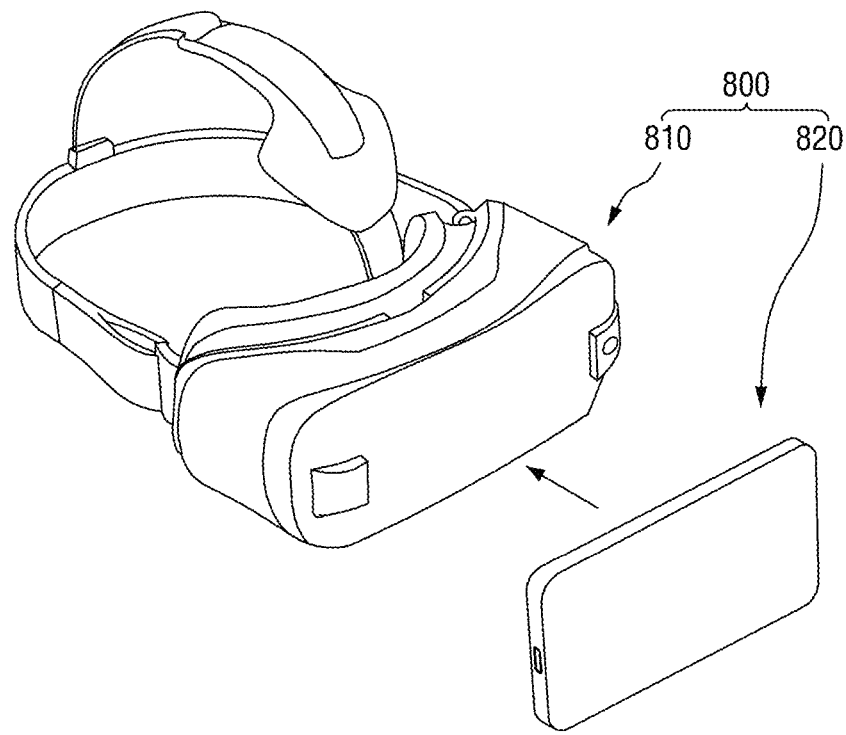
FIG. 30 is a view illustrating a head mount display device according to another exemplary embodiment of the disclosure.

FIG. 30 is a view illustrating a head mount display device according to an alternative exemplary embodiment of the disclosure.

Referring to FIG. 30, an exemplary embodiment of a head mount display device 800 may include a head mount device 810 and a display device 820.

In such an embodiment, the head mount device 810 may be coupled to the display device 820. In such an embodiment, the display device 820 may include a display panel having a plurality of display elements which display an image and a diffraction pattern layer which diffracts light emitted from the display elements. In such an embodiment, the display device 820 may be one of exemplary embodiments of the display device set forth herein.

In an exemplary embodiment, the head mount device 810 may include a connector for electrical connection with the display device 820, and a frame for physical connection therewith. In such an embodiment, the head mount device 810 may include a cover for preventing an external impact and preventing separation of the display device 820.

In such an embodiment, the head mount device 810 may be coupled to the display device 820, the display device 820 may include the diffraction pattern layer, and thus the effective light emission area may be enlarged to reduce the SDE.

According to exemplary embodiments of the disclosure, an effective light emission area ratio may be increased.

In such embodiments, a degree of visual blurring recognition may be minimized.

In such embodiments, in a head mount display device, a SDE may be reduced.

The invention should not be construed as being limited to the exemplary embodiments set forth herein. Rather, these exemplary embodiments are provided so that this disclosure will be thorough and complete and will fully convey the concept of the present invention to those skilled in the art.

While the invention has been particularly shown and described with reference to exemplary embodiments thereof, it will be understood by those of ordinary skill in the art that various changes in form and details may be made therein without departing from the spirit or scope of the present invention as defined by the following claims.

What is claimed is:

1. A display device comprising:
   a substrate;
   a plurality of display elements disposed on the substrate;
   a pixel definition film including a plurality of openings which overlap the plurality of display elements;
   an encapsulation layer disposed on the plurality of display elements and the pixel definition film; and
   a diffraction pattern layer comprising a plurality of diffraction patterns disposed on the encapsulation layer with a predetermined pitch,
   wherein the plurality of diffraction patterns diffracts light emitted from the plurality of display elements in a pattern different from an arrangement pattern of the plurality of display elements,
   wherein a number of light emission patterns of the light diffracted by the plurality of diffraction patterns is greater than a number of light emission patterns of the light emitted from the plurality of display elements, and wherein the plurality of diffraction patterns does not overlap at least one opening of the plurality of openings.

2. The display device of claim 1, wherein
a first distance is defined as a distance between adjacent diffraction patterns in one direction, between which none of the at least one opening is disposed, among the plurality of diffraction patterns,
a second distance is defined as a distance between other adjacent diffraction patterns in the one direction, between which the at least one opening is disposed, among the plurality of diffraction patterns, and
the first distance is smaller than the second distance.

3. The display device of claim 1, wherein the encapsulation layer includes a glass insulating substrate or at least one selected from an organic layer and an inorganic layer.

4. The display device of claim 1, wherein
a region which overlaps the plurality of display elements is defined as a display region,
a region which does not overlap the plurality of display elements is defined as a non-display region, and
the plurality of diffraction patterns is disposed in the non-display region.

5. The display device of claim 4, wherein the plurality of diffraction patterns does not overlap the display region.

6. The display device of claim 1, wherein
a width of a cross section of each of the plurality of diffraction patterns is defined as a length of each diffraction pattern, and
the predetermined pitch and the length of each diffraction pattern satisfy the following inequation:

$$0.4 \leq d1/DP1 < 1,$$

wherein DP1 denotes the predetermined pitch, and d1 denotes the length of each diffraction pattern.

7. The display device of claim 1, wherein the plurality of diffraction patterns diffracts the light emitted from the plurality of display elements, and the plurality of diffraction patterns generates a reference light emission pattern and a replicated light emission pattern.

8. The display device of claim 7, wherein luminance of the replicated light emission pattern is 3% or greater of luminance of the reference light emission pattern.

9. The display device of claim 7, wherein
the plurality of display elements includes a first display element and a second display element, which display a same color as each other, and
a distance between the first display element and the second display element is defined as a distance between the display elements,
a distance between the reference light emission pattern and the replicated light emission pattern is defined as a diffraction distance, and
the distance between the display elements and the diffraction distance satisfies the following inequation: $0.1 \leq \beta/PP1 \leq 1.9$, wherein PP1 denotes the distance between the display elements, and $\beta$ denotes the diffraction distance.

10. The display device of claim 1, wherein
the diffraction pattern layer further includes a protective layer disposed on the plurality of diffraction patterns,
the plurality of diffraction patterns has a first refractive index,
the protective layer has a second refractive index different from the first refractive index, and the first refractive index, the second refractive index and a thickness of one of the plurality of diffraction patterns satisfy the following inequation: $\Delta n \cdot t1 \neq A$, wherein $\Delta n$ denotes an absolute value of the difference of n1 and n2, n1 denotes the first refractive index, n2 denotes the second refractive index, t1 denotes the thickness of the one of the plurality of diffraction patterns, and A denotes any value in nanometer satisfying the following inequation:

$$(m \times \lambda) - 60 \text{ nanometers} \leq A \leq (m \times \lambda) + 60$$

nanometers, wherein $\lambda$ denotes a wavelength of the light emitted from the plurality of display elements, and m is an integer of 0 or greater.

11. The display device of claim 1, the plurality of display elements includes a first display element emitting a first light and a second display element emitting a second light,
the first display element does not overlap the plurality of diffraction patterns, and
the second display element overlaps at least one diffraction pattern of the plurality of diffraction patterns.

12. A display device comprising:
a substrate;
a plurality of display elements disposed on the substrate;
a pixel definition film including a plurality of openings which overlap the plurality of display elements;
an encapsulation layer disposed on the plurality of display elements and the pixel definition film; and
a diffraction pattern layer including a protective layer disposed on the encapsulation layer, and a plurality of holes defined in the protective layer,
wherein a diffraction pattern of the diffraction pattern layer is defined as the protective layer on the encapsulation layer except the plurality of holes,
wherein the diffractive pattern is disposed with a predetermined pitch, and
wherein the diffraction pattern diffracts light emitted from the plurality of display elements in a pattern different from an arrangement pattern of the plurality of display elements, and
wherein a number of light emission patterns of the light diffracted by the plurality of diffraction patterns is greater than a number of light emission patterns of the light emitted from the plurality of display elements.

13. The display device of claim 12, wherein the diffraction pattern is integrally formed.

14. The display device of claim 12, wherein the diffraction pattern surrounds each of the plurality of holes.

15. The display device of claim 12, wherein the encapsulation layer includes a glass insulating substrate or at least one selected from an organic layer and an inorganic layer.

16. The display device of claim 12, wherein each of the plurality of holes overlaps a corresponding opening among the plurality of openings.

17. The display device of claim 12, wherein
a width of a cross section of the diffraction pattern in one direction is defined as a length of the diffraction pattern, and
the predetermined pitch and the length of the diffraction pattern satisfy the following inequation:

$$0.4 \leq d1/DP1 < 1,$$

wherein DP1 denotes the predetermined pitch, and d1 denotes the length of the diffraction pattern.

18. A display device comprising:

a substrate;

a plurality of display elements disposed on the substrate;

a pixel definition film including a plurality of openings which overlap the plurality of display elements;

an encapsulation layer disposed on the plurality of display elements and the pixel definition film; and a diffraction pattern layer comprising a plurality of diffraction patterns disposed on the encapsulation layer, wherein the plurality of diffraction patterns diffracts light emitted from the plurality of display elements in a pattern different from an arrangement pattern of the plurality of display elements, wherein a number of light emission patterns of the light diffracted by the plurality of diffraction patterns is greater than a number of light emission patterns of the light emitted from the plurality of display elements, and wherein a first distance is defined as a distance between adjacent diffraction patterns in one direction, between which none of the plurality of openings is disposed, among the plurality of diffraction patterns arranged in the one direction, a second distance is defined as a distance between other adjacent diffraction patterns, between which one of the plurality of openings is disposed, among the plurality of diffraction patterns arranged in the one direction, and the first distance is smaller than the second distance.

19. The display device of claim 18, wherein the plurality of diffraction patterns does not overlap at least one opening of the plurality of openings.

20. The display device of claim 18, the encapsulation layer includes a glass insulating substrate or at least one selected from an organic layer and an inorganic layer.

* * * * *